（12） United States Patent
Ito et al.

(10) Patent No.: US 9,984,991 B2
(45) Date of Patent: May 29, 2018

(54) CIRCUIT DEVICE, ELECTRONIC APPARATUS AND MOVING OBJECT

(71) Applicant: Seiko Epson Corporation, Tokyo (JP)

(72) Inventors: Hisahiro Ito, Minowa (JP); Shoichiro Kasahara, Minowa (JP)

(73) Assignee: Seiko Epson Corporation (JP)

( * ) Notice: Subject to any disclaimer, the term of this patent is extended or adjusted under 35 U.S.C. 154(b) by 305 days.

(21) Appl. No.: 14/800,738

(22) Filed: Jul. 16, 2015

(65) Prior Publication Data
US 2016/0020379 A1 Jan. 21, 2016

(30) Foreign Application Priority Data
Jul. 18, 2014 (JP) .................................. 2014-147879

(51) Int. Cl.
H01L 41/09 (2006.01)
H01L 23/00 (2006.01)
B06B 1/06 (2006.01)
B06B 1/02 (2006.01)

(52) U.S. Cl.
CPC ............ *H01L 24/49* (2013.01); *B06B 1/0207* (2013.01); *B06B 1/0238* (2013.01); *B06B 1/0648* (2013.01); *B06B 2201/40* (2013.01); *B06B 2201/55* (2013.01); *B06B 2201/70* (2013.01); *H01L 24/48* (2013.01); *H01L 2224/05554* (2013.01); *H01L 2224/4813* (2013.01); *H01L 2224/49171* (2013.01); *H01L 2924/00014* (2013.01); *H01L 2924/141* (2013.01); *H01L 2924/143* (2013.01)

(58) Field of Classification Search
USPC .................................................. 310/340, 348
See application file for complete search history.

(56) References Cited

U.S. PATENT DOCUMENTS

| 6,407,432 | B1 | 6/2002 | Nemoto et al. |
| 7,830,074 | B2 * | 11/2010 | Kubena .................. H04R 17/10 310/348 |
| 8,242,573 | B2 * | 8/2012 | Kim .................. H01L 21/76237 257/170 |
| 2005/0012559 | A1 | 1/2005 | Shimodaira et al. |

(Continued)

FOREIGN PATENT DOCUMENTS

| JP | 05-243472 A | 9/1993 | |
| JP | 10-65105 A * | 3/1998 | ............. H01L 27/04 |

(Continued)

*Primary Examiner* — Thomas Dougherty
(74) *Attorney, Agent, or Firm* — Harness, Dickey & Pierce, P.L.C.

(57) ABSTRACT

In order to reduce crosstalk between analog and digital signals, a circuit device includes a vibrator element, a semiconductor device, and a package. In the semiconductor device, an analog pad is provided along a first side facing in a first direction when the semiconductor device is seen in plan view. In addition, a digital pad is provided along aside facing in a second direction opposite to the first direction, that is, a second side facing the first side. In the package, an analog terminal which is connected to the analog pad is provided on a first side of the package facing in the first direction. In addition, a digital terminal which is connected to the digital pad is provided on a second side of the package facing in the second direction.

19 Claims, 13 Drawing Sheets

(56) References Cited

U.S. PATENT DOCUMENTS

| | | | |
|---|---|---|---|
| 2007/0182613 A1 | 8/2007 | Deguchi | |
| 2007/0188369 A1 | 8/2007 | Itagaki | |
| 2007/0290578 A1 | 12/2007 | Horie | |
| 2008/0099887 A1* | 5/2008 | Song | H01L 23/552 |
| | | | 257/663 |
| 2008/0197883 A1 | 8/2008 | Onishi | |
| 2009/0127713 A1* | 5/2009 | Okuda | H01L 23/585 |
| | | | 257/773 |
| 2014/0167292 A1* | 6/2014 | Masumura | H01L 24/48 |
| | | | 257/784 |

FOREIGN PATENT DOCUMENTS

| | | | | |
|---|---|---|---|---|
| JP | 11-055145 A | 2/1999 | | |
| JP | 2005-033761 A | 2/2005 | | |
| JP | 3925160 B2 * | 6/2007 | | G01R 29/02 |
| JP | 2007-214876 A | 8/2007 | | |
| JP | 2007-251139 A | 9/2007 | | |
| JP | 2007-281011 A | 10/2007 | | |
| JP | 2007-336346 A | 12/2007 | | |
| JP | 2008-206307 A | 9/2008 | | |
| JP | 2011-171956 A | 9/2011 | | |
| JP | 2012-160613 A | 8/2012 | | |
| WO | WO-99-66557 A1 | 12/1999 | | |

* cited by examiner (COMPARATIVE EXAMPLE)

CIRCUIT DEVICE, ELECTRONIC APPARATUS AND MOVING OBJECT

BACKGROUND

1. Technical Field

The present invention relates to a circuit device, an electronic apparatus, a moving object, and the like.

2. Related Art

A digital-analog mixed IC (mixed signal IC) has digital circuits and analog circuits integrated on the same semiconductor chip. In such an IC, crosstalk (coupling) between a digital signal and an analog signal has a tendency to be generated, and particularly, a deterioration in an analog signal (for example, S/N deterioration) due to the crosstalk is a problem that often arises.

As a countermeasure against such crosstalk between digital and analog signals, for example, JP-A-2007-281011 discloses a method in which an analog pad is disposed in an analog circuit region of a semiconductor chip, a digital pad is disposed outside thereof along a side of the semiconductor chip, and wiring of wires is performed on an electrode pad of a package from these pads. In such a method, since wiring to the analog pad and wiring to the digital pad do not run in parallel with each other within the semiconductor chip, it is possible to reduce crosstalk within the semiconductor chip.

Incidentally, in a digital-analog mixed IC, a vibrator (such as, for example, a quartz crystal resonator) is often used as a generation source of a clock signal or the like. For example, an oscillation circuit built into the IC oscillates an external vibrator, and processes in the inside of the IC are performed by an oscillation signal from the oscillation circuit.

In the IC using this vibrator, since the vibrator and the IC are separate from each other, it is difficult to meet the need for a reduction in size or a reduction in the number of components. For example, there is an RF transmitter as a digital-analog mixed IC using a vibrator. The RF transmitter is used for a keyless entry module (key side) or the like of an automobile, and has a great advantage of a reduction in size.

As a method of a reduction in size, a method of causing a vibrator element and a semiconductor chip to be built into one package is considered. However, there is a problem that crosstalk between a digital signal and an analog signal has a greater tendency to be generated due to the integral formation of the vibrator element and a reduction in the size of a device. Not only crosstalk between wirings within the semiconductor chip, but also, for example, crosstalk between bonding wires or crosstalk between wirings on a substrate having an IC mounted therein has a tendency to be generated.

In the method disclosed in JP-A-2007-281011, analog wiring and digital wiring do not run in parallel with each other within the semiconductor chip, but an analog bonding wire and a digital bonding wire are extracted in the same direction, and thus crosstalk between the wires is not able to be reduced.

SUMMARY

An advantage of some aspects of the invention is to provide a circuit device with a built-in vibrator, an electronic apparatus, a moving object, and the like which are capable of reducing crosstalk between analog and digital signals.

Application Example 1

This application example relates to a circuit device including a semiconductor device and a package having the semiconductor device stored therein, wherein in the semiconductor device, an analog pad is provided along a first side facing in a first direction when the semiconductor device is seen in plan view, and a digital pad is provided along a side facing in a second direction opposite to the first direction, that is, a second side facing the first side, wherein in the package, only an analog terminal which is connected to the analog pad is provided along a first side of the package facing in the first direction, and only a digital terminal which is connected to the digital pad is provided along a second side of the package facing in the second direction.

According to this application example, the analog pad and the digital pad are provided separately from each other on the first side and the second side which face each other, and the analog terminal and the digital terminal are provided separately from each other on the first side of the package and the second side of the package which face each other. Thereby, in the circuit or wiring of the semiconductor device, the connection between the pad of the semiconductor device and the terminal of the package, an external wiring of the package, and the circuit arrangement thereof, it is possible to separately dispose analog elements and digital elements on the opposite sides, and to reduce crosstalk between analog and digital signals.

Application Example 2

According to this application example, the circuit device may further include a vibrator element, connected to the semiconductor device, which is stored in the package.

With such a configuration, it is possible to store the vibrator element and the semiconductor device in the package. In this manner, when the vibrator element is stored in the package, crosstalk between digital and analog signals has a greater tendency to be generated, but the analog pad and the digital pad are separated from each other in the semiconductor device, and the analog terminal and the digital terminal are separated from each other in the package, thereby allowing crosstalk to be reduced.

Application Example 3

According to this application example, in the semiconductor device, a pad for a vibrator element which is connected to the vibrator element may be provided along a third side extending along a direction intersecting the first side and the second side.

With such a configuration, the pad for a vibrator element is disposed along the third side to thereby be located at a position distant from the analog pad which is disposed along the first side, and a wiring for connecting an oscillation circuit to the pad for a vibrator element and a wiring for connecting an analog circuit to the analog pad are separated from each other, thereby allowing crosstalk within the semiconductor device to be reduced.

Application Example 4

According to this application example, the circuit device may further include a first wire group for connecting the analog pad to the analog terminal, a second wire group for connecting the digital pad to the digital terminal, and a third wire group for connecting the vibrator element to the pad for a vibrator element.

The first wire group which is connected to the analog pad is directed outward from the first side, and the second wire group which is connected to the digital pad is directed outward from the second side. In addition, the third wire group which is connected to the pad for a vibrator element is directed outward from the third side. Thereby, the analog wire extends in a direction running away from the digital wire and the wire for a vibrator element, and crosstalk between the wires is reduced.

Application Example 5

According to this application example, the vibrator element and the pad for a vibrator element may be connected to each other by the third wire group and an in-package wiring of the package.

Since the third wire group is directed outward from the third side, the in-package wiring which is connected to the front thereof becomes farther away from the analog pad and the first wire group for analog use. In this manner, a generation source of digital noise and a passage portion of an analog signal are disposed so as to run away toward the outside, and thus crosstalk between digital and analog signals is effectively reduced.

Application Example 6

According to this application example, in the semiconductor device, the first circuit region on the first direction side may be provided with an analog circuit having a circuit which is connected to the analog pad, and the second circuit region on the second direction side may be provided with a digital circuit having a circuit which is connected to the digital pad.

With such a configuration, both the analog pad and the analog circuit are disposed on the first direction side, and both the digital pad and the digital circuit are disposed on the second direction side. Thereby, it is possible to dispose a wiring for connecting the analog pad to the analog circuit and a wiring for connecting the digital pad to the digital circuit without running in parallel with each other, or intersecting or approaching each other, and to reduce crosstalk between the wiring within the semiconductor device.

Application Example 7

According to this application example, in the semiconductor device, the first circuit region on the first direction side may be provided with an analog circuit having a circuit which is connected to the analog pad, and the second circuit region on the second direction side may be provided with a digital circuit having a circuit which is connected to the digital pad, and when a side intersecting the first side and the second side is set to a third side, and a side facing the third side which extends along the direction intersecting the first side and the second side is set to a fourth side, a buffer circuit for an analog signal may be disposed in a region closer to the fourth side than the third side, in the first circuit region, and an oscillation circuit of the vibrator element may be disposed in a region closer to the third side than the fourth side, in the second circuit region.

With such a configuration, the oscillation circuit which is a generation source of much digital noise and the buffer circuit for an analog signal which is an output stage for the analog signal can be disposed at extremely distant positions within the semiconductor device. Since the coupling of noise in the output stage does not make it possible to remove noise at least within the semiconductor device, it is important in the reduction of noise to prevent crosstalk from being generated by separating the output stage from the oscillation circuit.

Application Example 8

According to this application example, the semiconductor device may include a first regulator that supplies an analog power supply voltage to the analog circuit, and a second regulator that supplies a digital power supply voltage to the digital circuit.

Application Example 9

According to this application example, the analog power supply voltage may be supplied from the first regulator to the analog circuit through a first power supply line, and the digital power supply voltage may be supplied from the second regulator to the digital circuit through a second power supply line which is separated from the first power supply line.

When a power supply is shared by the analog circuit and the digital circuit, noise which is generated by the digital circuit fluctuates the power supply voltage through the impedance of the shared portion of the power supply lines, and this fluctuation is coupled to the analog signal through the analog circuit. In this regard, according to this application example, it is possible to prevent crosstalk between analog and digital signals through the power supply from being generated, by the separation of the regulators or the power supply lines.

Application Example 10

According to this application example, the vibrator element may be disposed in the package so as to overlap the semiconductor device when seen in plan view.

With such a configuration, it is possible to not only achieve a reduction in size by forming the vibrator element and the semiconductor device into one package, but also to reduce amounting area by reducing the size of the package when seen in plan view. In addition, when such a reduction in size is performed, a distance between the digital and analog circuits or the wirings becomes smaller, and crosstalk has a tendency to be generated, but in this application example, both a reduction in size and a reduction in crosstalk can be achieved by the separate arrangement of the pads or the terminals described above.

Application Example 11

According to this application example, the semiconductor device may include an oscillation circuit of the vibrator element, and a radio communication circuit that performs a radio communication process on the basis of an oscillation signal from the oscillation circuit.

In radio communication, multiplication based on PLL is performed using the oscillation signal of the vibrator element as a reference clock. In this case, the signal of the reference clock is coupled to an analog output and thus reference leakage (spurious noise at the frequency of the reference clock) is generated. In this regard, according to this application example, the signal of the reference clock and the analog output are separated from each other by the separate arrangement of the pads or the terminals, the separate arrangement of the oscillation circuit and the buffer circuit for an analog signal, or the like, and thus reference leakage is not likely to be generated.

Application Example 12

According to this application example, the digital terminal may be a terminal which is connected to an external control controller.

Since the digital terminal is provided on the second side of the package, for example, the external control controller is mounted so as to face the second side of the package, and thus the external control controller and the wiring of the digital terminal can be simplified. In addition, since the analog terminal is provided on the side of the first package, it is possible to dispose the external control controller and the wiring of the digital terminal without being brought close to the analog wiring, and to reduce crosstalk on a mounting substrate.

Application Example 13

According to this application example, in the package, an inspection terminal of the vibrator element may be provided on a third side of the package which extends along a direction intersecting the first side of the package and the second side of the package.

With such a configuration, even when the vibrator element is built into the package, it is possible to directly inspect the vibrator element from the outside of the package.

Application Example 14

According to this application example, the analog terminal may include a transmission signal output terminal for radio output, and a ground terminal for radio output which is disposed adjacent to the transmission signal output terminal for radio output.

With such a configuration, a distance between the wiring connected to the terminal for radio output and the wiring connected to the GND terminal for radio output becomes shorter on a mounting substrate. Thereby, it is possible to reduce unnecessary radiation from a region between these wirings.

Application Example 15

This application example relates to an electronic apparatus including the circuit device described in any of the above application examples.

Application Example 16

This application example relates to a moving object including the circuit device described in any of the above application examples.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described in detail. Meanwhile, the embodiments described below do not unduly limit the content of the invention described in the appended claims, and all the configurations described in the embodiments are not necessarily essential as solving means of the invention.

1. Comparative Example

Figure 1:
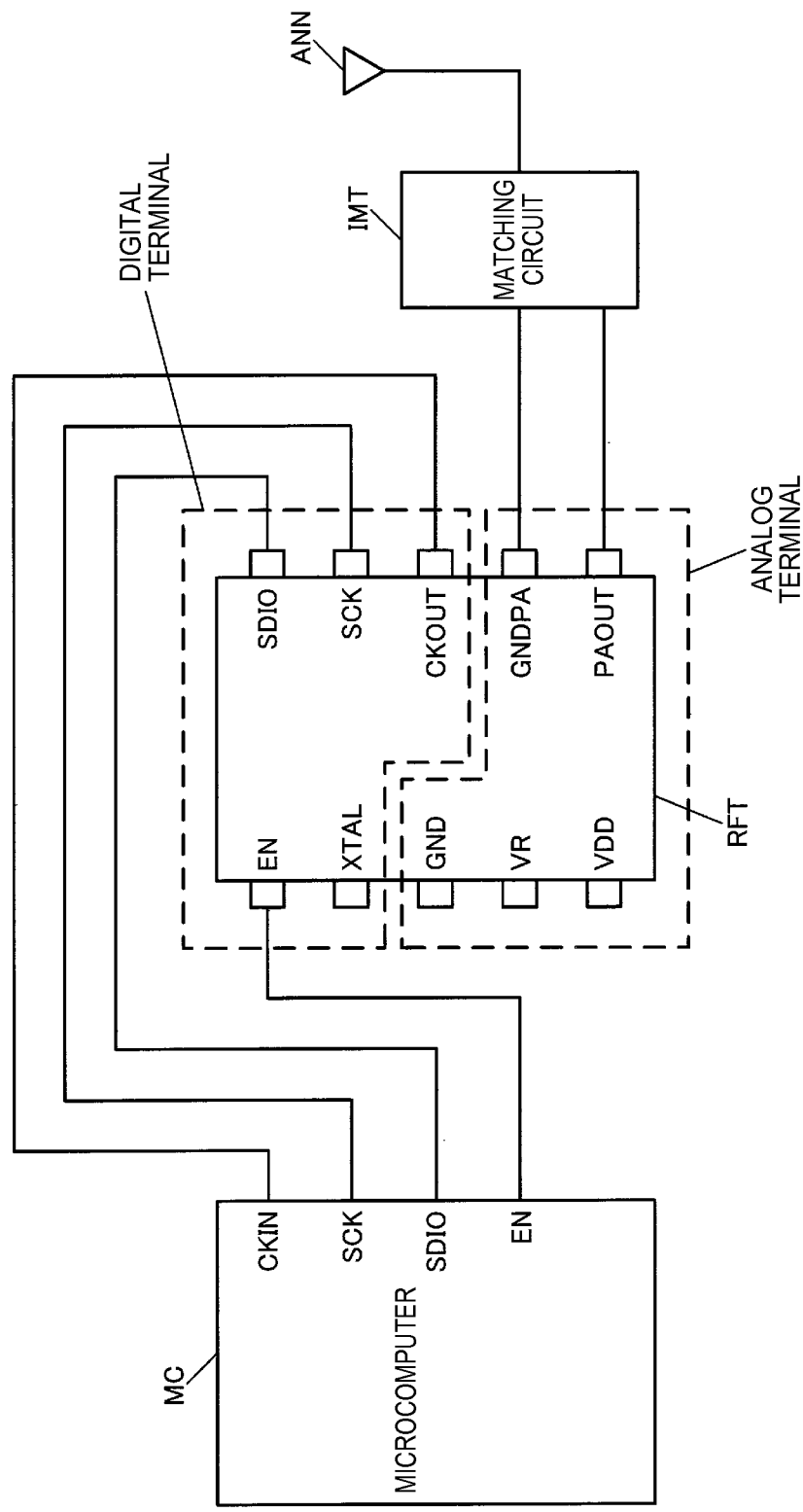
FIG. 1 is a comparative example of a radio communication device, and a configuration example of a system including the radio communication device.

FIG. 1 shows a comparative example of a radio communication device, and a configuration example of a system including the radio communication device. The system of FIG. 1 includes a microcomputer MC, a radio communication device RFT, a matching circuit IMT, and an antenna ANN.

The radio communication device RFT is a device that generates a radio transmission signal on the basis of control from the microcomputer MC, and performs radio transmission through the matching circuit IMT and the antenna ANN. Specifically, an external quartz crystal resonator is connected between a terminal XTAL and a ground terminal GND, and the quartz crystal resonator is oscillated by an oscillation circuit which is built into the radio communication device RFT. The radio communication device RFT supplies a clock signal, which is generated from the oscillation signal, from a terminal CKOUT to the microcomputer MC.

The microcomputer MC operates on the basis of the clock signal, and inputs and outputs a control signal or radio transmission data through an enable terminal EN, a data input and output terminal SDIO, and a data input and output clock terminal SCK of the radio communication device RFT.

The radio communication device RFT multiplies an oscillation signal through a PLL circuit to generate a carrier wave signal for radio communication, modulates the carrier wave signal on the basis of the radio transmission data to generate a transmission signal, and outputs the transmission signal from output terminals GNDPA and PAOUT. The matching circuit IMT is a circuit that performs impedance matching between the radio communication device RFT and the antenna ANN. The transmission signal is transmitted from the antenna ANN through the matching circuit IMT.

Meanwhile, a terminal VDD is a terminal to which a power supply voltage is supplied from a power supply (such as, for example, secondary battery), and a terminal VR is a terminal for outputting a voltage, which is generated by a regulator, from the power supply voltage.

Among the above-mentioned terminals, the terminals XTAL, EN, SDIO, SCK, and CKOUT are digital terminals for inputting and outputting a digital signal, and the terminals GNDPA, PAOUT, GND, VR, and VDD are analog terminals for inputting and outputting an analog signal. A package of the radio communication device RFT is rectangular, and digital terminals are separately disposed at two long sides. In addition, analog terminals are also separately disposed at two long sides, and are disposed interspersed with the digital terminals at each of the long sides.

With such a terminal arrangement, as shown in FIG. 1, wirings from the microcomputer MC to the radio communication device RFT require complicated routing on amounting substrate, and a wiring of a digital signal and a wiring of an analog signal (for example, connection wirings of the terminals CKOUT and GNDPA) come close to each other. In addition, since digital terminals and analog terminals are disposed at the same long side, bonding wires are located next to each other within the package. For these reasons, in the comparative example of FIG. 1, there is a problem that crosstalk (coupling) between an analog signal and a digital signal is more likely to be generated. In addition, since a vibrator is external, or routing of wirings becomes complicated, there is a problem that a reduction in the size of a system is interfered with.

Particularly, in radio communication, standards are specified by laws and regulations, and signal levels in a communication band and signal levels in other bands are specified, but in satisfying the standards, crosstalk is a problem that often arises. There are various factors in unnecessary noise (spurious noise) out of the communication band. For example, there is noise due to reference leakage, in radio communication in which a PLL circuit is used. In radio communication, since a reference clock generated in an oscillator is multiplied in PLL, the frequency of a carrier wave is different from the frequency of the reference clock. A phenomenon in which this reference clock leaks to a transmission signal to generate spurious noise is reference leakage. In the comparative example of FIG. 1, the reference clock (or, clock obtained by frequency-dividing the reference clock) is output from the terminal CKOUT, and the terminal CKOUT is adjacent to the analog output terminal GNDPA. For this reason, the reference clock and the transmission signal are coupled to each other, and thus there is a high possibility of reference leakage being generated.

2. Circuit Device

Figure 2:
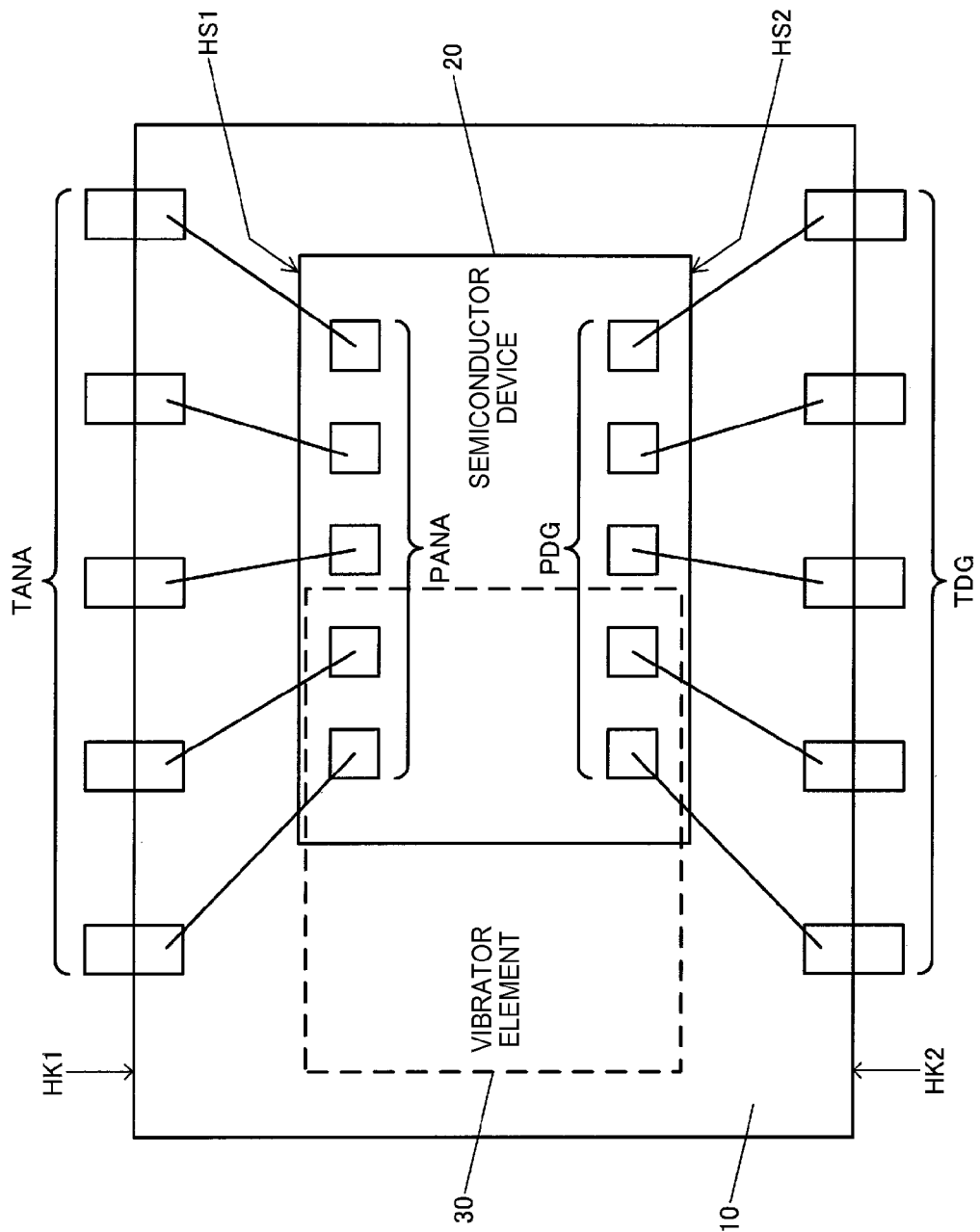
FIG. 2 is a configuration example of a circuit device of the present embodiment.
Figure 2:
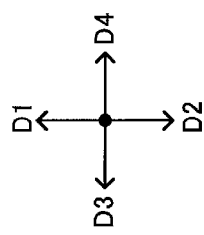

FIG. 2 shows a configuration example of a circuit device of the present embodiment which is capable of solving the above-mentioned problem. Meanwhile, hereinafter, a description is given by taking an example of a case where a vibrator element is stored in a package, but the circuit device of the present embodiment can also be applied to a case where the vibrator element is not stored in the package.

The circuit device includes a vibrator element 30, a semiconductor device 20 which is connected to the vibrator element 30, and a package 10 that stores the vibrator element 30 and the semiconductor device 20.

In the semiconductor device 20, an analog pad PANA is provided along a first side HS1 facing in a first direction D1 when the semiconductor device 20 is seen in plan view. In addition, a digital pad PDG is provided along a side facing in a second direction D2 opposite to the first direction D1, that is, a second side HS2 facing the first side HS1.

In the package 10, a first side HK1 of the package facing in the first direction D1 is provided with only an analog terminal TANA which is connected to the analog pad PANA. In addition, a second side HK2 of the package facing in the second direction D2 is provided with only a digital terminal TDG which is connected to the digital pad PDG.

More specifically, the vibrator element 30 is a solid vibrator element (piezoelectric vibrator element) that generates a vibration of an inherent frequency by applying a voltage. For example, the vibrator element 30 is a quartz crystal vibrator element (for example, AT cut-type vibrator element). Alternatively, the vibrator element may be a ceramic vibrator element or the like. The vibrator element 30 is disposed on a third direction D3 side or a fourth direction D4 side of the semiconductor device 20 within the package 10, and is disposed so as to overlap the semiconductor device 20 when the semiconductor device 20 is seen in plan view. The third direction D3 and the fourth direction D4 are directions intersecting (for example, orthogonal to) the first direction D1 and the second direction D2.

Meanwhile, in FIG. 2, the vibrator element 30 and the semiconductor device 20 are disposed so as to overlap each other when seen in plan view in the thickness direction of the substrate of the semiconductor device 20, but there is no limitation thereto. For example, the vibrator element 30 and the semiconductor device 20 may be disposed so as not to overlap each other when seen in plan view.

The package 10 is used to seal the vibrator element and the semiconductor device 20, and to connect the semiconductor device 20 to an external circuit or a wiring (for example, printed substrate wiring) through terminals provided in the package 10. For example, the package is constituted by a frame of a ceramic sheet or a plastic mold, and metallic posts, electrode pads, wirings, terminals and the like which are formed on the surface of the frame and within the package.

The semiconductor device 20 has analog circuits and digital circuits formed in a semiconductor substrate (such as, for example, silicon substrate) through a semiconductor process. The semiconductor process is a process constituted by steps such as, for example, impurity introduction, insulating layer formation, polysilicon layer formation, aluminum layer formation, or passivation layer formation.

The digital pad PDG and the digital terminal TDG are a pad and a terminal for inputting or outputting a digital signal. The digital signal is a signal which is represented by a binary value of a first voltage level (for example, power supply voltage level) on the high-potential side and a second voltage level (for example, ground voltage level) on the low-potential side. The digital circuit is a circuit that processes the digital signal.

The analog pad PANA and the analog terminal TANA are a pad and a terminal for inputting or outputting an analog signal. The analog signal is a voltage signal capable of taking an arbitrary voltage level between a first voltage level and a second voltage level, or a current signal capable of taking an arbitrary current value. In addition, the analog signal includes a power supply voltage or a ground voltage. The analog circuit is a circuit that processes the analog signal.

Meanwhile, the definition of "analog" and "digital" is not limited to those described above. For example, in the semiconductor device 20 of the radio communication device which is described later in FIG. 9, a power supply for an analog circuit and a power supply for a digital circuit are prepared. In this case, the digital circuit and the analog circuit may be distinguished from each other depending on which power supply these circuits belong to, that is, from which power supply line a power supply voltage is supplied. Alternatively, in the semiconductor device 20 of FIG. 9, a portion of a fractional -N-type PLL circuit 210 belongs to the power supply for a digital circuit. The portion of the circuit is a circuit that performs a digital operation at the frequency of the reference clock, and has an effect of suppressing reference leakage by a power supply line being separated. In this manner, the digital circuit may be defined as a circuit serving as a generation source of digital noise (reference leakage in FIG. 9), and the analog circuit may be defined as a circuit element leading to signal deterioration when the noise is coupled.

As described above, the analog pad PANA is provided along the first side HS1 of the semiconductor device 20, but the first side HS1 herein is, for example, a side located in the first direction D1 when seen from the central portion of the semiconductor device 20. In addition, the second side HS2 provided with the digital pad PDG is, for example, a side located in the second direction D2 when seen from the central portion of the semiconductor device 20. For example, when the shape of the semiconductor device 20 is rectangular, two parallel long sides forming the rectangle are the first side HS1 and the second side HS2. The first direction D1 and the second direction D2 are directions in a plane parallel to the substrate plane of the semiconductor device 20, and are directions which are parallel and opposite to each other (directions are different from each other by 180 degrees).

With respect to the sides of the package 10, similarly, a side located in the first direction D1 when seen from, for example, the central portion (or position provided with the semiconductor device 20) of the package 10 is the first side HK1 of the package. That is, the first side HK1 of the package faces the first side HS1 of the semiconductor device 20. In addition, a side located in the second direction D2 when seen from the central portion of the package 10 is the second side of the package, and the second side HK2 of the package faces the second side HS2 of the semiconductor device 20. For example, the shape of the package 10 is rectangular, and two long sides forming the rectangle are the first side HK1 of the package and the second side HK2 of the package.

The above pads and terminals are provided along the sides, but the wording "along the sides" as used herein is not limited to a case where the pads and the terminals come into contact with the sides, and the pads and the terminals may be away from the sides (for example, may be disposed on the inside). In addition, the pads and the terminals are not required to be lined up in a straight line along the sides, and distances from the sides of each pad and each terminal may be different from each other. For example, the pads and the terminals may be lined up alternately (in a zigzag or in a meandering manner).

According to the above embodiment, it is possible to realize a small-sized circuit device by making the vibrator element 30 be built into the package 10, and to reduce crosstalk between the digital signal and the analog signal.

Specifically, the analog pad PANA and the digital pad PDG are separated to two sides (HS1 and HS2) of the semiconductor device 20 which face each other, thereby allowing crosstalk within the semiconductor device 20 to be reduced. That is, since an analog wiring that connects the analog circuit to the analog pad PANA and a digital wiring that connects the digital circuit to the digital pad PDG extend in opposite directions, it is easy to perform a layout design while avoiding the parallel running or intersection of the analog wiring and the digital wiring, and thus it is possible to reduce crosstalk between the wirings or between the circuits.

In addition, the analog terminal TANA and the digital terminal TDG are separated to two sides (HK1 and HK2) of the package 10 which face each other, thereby allowing crosstalk inside the package 10 and outside the package 10 to be reduced. That is, since an analog wire that connects the analog pad PANA to the analog terminal TANA and a digital wire that connects the digital pad PDG to the digital terminal TDG can be disposed in opposite directions, the analog wire and the digital wire do not run in parallel with each other, and thus it is possible to reduce crosstalk between the wires. In addition, in the system including a circuit device, a digital unit and an analog unit are disposed separately on the first side HK1 of the package and the second side HK2 of the package, on the mounting substrate, and thus it is possible to reduce crosstalk on the mounting substrate.

For example, in the communication system including a radio communication device (circuit device) described later in FIG. 8, a microcomputer 410 which is a digital unit, a matching circuit 430 which is an analog unit, and an antenna 440 can be disposed on both sides of a radio communication device 420. Thereby, it is possible to realize very simple wirings on the mounting substrate, and to reduce crosstalk on the mounting substrate without bringing a wiring for the analog signal into contact with a wiring for the digital signal. As described in the comparative example of FIG. 1, in radio communication, it is particularly important to observe standards of laws and regulations, and as in the present embodiment, the capability of reducing crosstalk at every stage is very advantageous. In addition, in radio communication, reference leakage is generated in principle, but in the present embodiment, the terminal CKOUT (digital) of the reference clock and the terminals VSSPA and PAOUT (analog) of the transmission signal do not come close to each other, and thus it is possible to effectively reduce reference leakage.

In addition, as described later in FIG. 8, the vibrator element 30 and the semiconductor device 20 are formed into one package, and thus it is possible to reduce an error of an oscillation frequency. In radio communication, it is known that receiving sensitivity becomes higher as a receiving band becomes narrower, and the receiving band is made narrower as a frequency error on the transmission side becomes smaller, thereby allowing the receiving sensitivity to be increased. This means communication can be performed with lower transmission power. For example, in a keyless entry module or the like, limited power (battery) can be saved by the saving of transmission power. In addition, as described later in FIGS. 5 to 7, the mounting substrate is not required to be provided with a wiring for an oscillation signal by the formation of the vibrator element 30 into one package, and thus it is possible to eliminate unnecessary radiation from the wiring.

3. Layout Configuration of Semiconductor Device

Hereinafter, the detailed configuration of a circuit device of the present embodiment will be described by taking an example of a case where the circuit device is applied to the radio communication device. However, the circuit device of the present embodiment is not limited to the radio communication device, and may be a device in which the vibrator element and the semiconductor device (mixed signal IC) are stored in one package. It is assumed that the semiconductor device has, for example, at least one function other than a function of oscillating the vibrator element. Radio communication is an example of this function.

Figure 3:
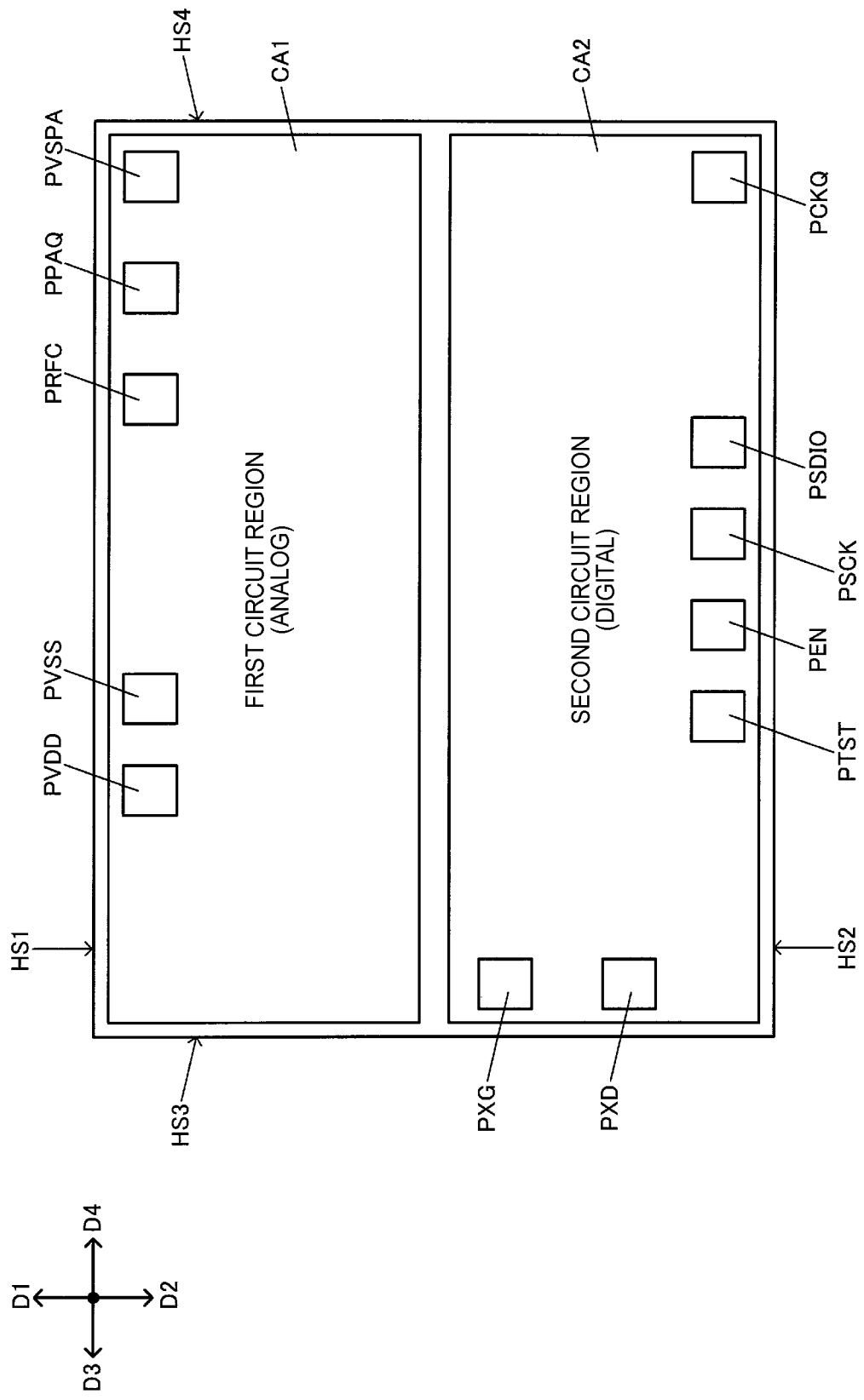
FIG. 3 is a first layout configuration example of a semiconductor device.

FIG. 3 shows a first layout configuration example of the semiconductor device. FIG. 3 is a layout when the semiconductor device 20 is seen in plan view from the surface side having circuits formed thereon.

In the semiconductor device 20, a first circuit region CA1 on the first direction D1 side is provided with an analog circuit having a circuit which is connected to the analog pad PANA. In addition, a second circuit region CA2 on the second direction D2 side is provided with a digital circuit having a circuit which is connected to the digital pad PDG.

The semiconductor device 20 of FIG. 3 includes, as the analog pad PANA, pads PRFC and PPAQ for outputting a radio signal, a pad PVSPA for supplying a ground voltage for a radio signal, a pad PVDD to which a power supply voltage of the system is input, and a pad PVSS to which a ground voltage of the system is input. The semiconductor device includes, as the digital pad PDG, a pad PTST for inputting and outputting a test signal, a pad PEN to which an enable signal is input, a pad PSCK to which a clock for a control signal is input, a pad PSDIO to and from which a control signal (such as a control command or register setting contents) or radio transmission data is input and output, a pad PCKQ for outputting a clock signal, and pads PXG and PXD for connecting an oscillation circuit to the vibrator element 30.

The first circuit region CA1 is a region which is located in the first direction D1, that is, provided on the first side HS1. That is, the first circuit region CA1 is a region which comes into contact with (or comes close to) at least the first side HS1, and is a region which does not come into contact with (or does not come close to) the second side HS2. The analog pads PRFC, PPAQ, PVSPA, PVDD, and PVSS are disposed in the first circuit region CA1, and wiring between these pads and the analog circuit is performed within, for example, the first circuit region CA1.

The second circuit region CA2 is a region which is located in the second direction D2, that is, provided on the second side HS2. That is, the second circuit region CA2 is a region which comes into contact with (or comes close to) at least the second side HS2, and is a region which does not come into contact with (or does not come close to) the first side HS1. The digital pads PTST, PEN, PSCK, PSDIO, PCKQ, PXG, and PXD are disposed in the second circuit region CA2, and wiring between these pads and the digital circuit is performed within, for example, the second circuit region CA2.

According to the above embodiment, wirings from the analog circuits to the analog pad PANA, or wirings between the analog circuits can be connected to each other within the first circuit region CA1. In addition, wirings from the digital circuits to the digital pad PDG, or wirings between the digital circuits can be connected to each other within the second circuit region CA2. Thereby, the analog circuit and the digital circuit, and the analog signal wiring and the digital signal wiring can be clearly separated from each other within the semiconductor device 20. That is, since the analog signal wiring is not required to be routed near the digital circuit or the digital signal wiring, it is possible to avoid coupling between digital and analog signals. In addition, since the arrangement regions are clear, there is a low possibility of the analog signal wiring and the digital signal wiring running in parallel with each other unintentionally, and thus a design burden for checking the parallel running is reduced.

In addition, the analog circuit is disposed on the first direction D1 side, and the digital circuit is disposed on the second direction D2 side. Thereby, naturally, the analog pad PANA is disposed on the first side HS1, and the digital pad PDG is disposed on the second side HS2. Thereby, in the package 10, the analog terminal TANA and the digital terminal TDG are also disposed on separate sides, and thus it is possible to reduce crosstalk in all the stages including the semiconductor device 20, the bonding wire, and the outside of the package 10, as described above.

Next, the arrangement of the pads PXG and PXD for a vibrator element which are connected to the vibrator element 30 will be described. As shown in FIG. 3, the pads PXG and PXD for a vibrator element are provided along a third side HS3 extending along a direction (for example, first direction D1) intersecting the first side HS1 and the second side HS2.

The third side HS3 is, for example, a side located in the third direction D3 when seen from the central portion of the semiconductor device 20. The third direction D3 is a direction in an in-plane parallel to the substrate plane of the semiconductor device 20, and is a direction intersecting (for example, orthogonal to) the first direction D1 and the second direction D2. In a case where the semiconductor device 20 is rectangular or square in shape when seen in plan view, the third side HS3 is a side perpendicular to the first side HS1 and the second side HS2.

As described in the comparative example of FIG. 1, there is a problem of unnecessary radiation due to reference leakage in the radio communication device. As one of generation sources of reference leakage, the vibrator element and an oscillation circuit are considered. When the vibrator element 30 vibrates due to a piezoelectric effect, polarization according to the distortion (pressure) of the vibrator element 30 occurs, and the transfer of charge between the oscillation circuit and the vibrator element is generated. That is, the vibrator element 30 or the oscillation circuit serves as a generation source of very much digital noise. In the present embodiment, since the vibrator element 30 is built into the package 10, and the oscillation circuit is built into the semiconductor device 20, a condition is established in which reference leakage has a tendency to be generated.

In this regard, according to the present embodiment, the pads PXG and PXD for a vibrator element are provided along the third side HS3, and the analog pad PANA is provided along the first side HS1. Thereby, bonding wires which are connected to the analog pad PANA extend in the first direction D1, and bonding wires which are connected to the pads PXG and PXD for a vibrator element extend in the third direction D3. Since the first direction D1 and the third direction D3 are directions intersecting each other, the proximity or mixture of the bonding wires do not occur, and crosstalk between the oscillation signal and the analog signal is not likely to be generated. In this manner, it is possible to suppress reference leakage caused by the vibrator element 30 or the oscillation circuit.

In addition, the pads PXG and PXD for a vibrator element are provided on the third side HS3 intersecting the first side HS1, and thus a distance from the pads PXG and PXD for a vibrator element becomes far away along the first side HS1. That is, signals which are further required to avoid the influence of digital noise can be separated from the pads PXG and PXD for a vibrator element. For example, in the radio communication device, a PLL circuit is used, but reference leakage can be reduced by a low-pass filter (loop filter) of the PLL circuit to some extent. However, when reference leakage is carried on an output unit (such as a power amplifier) which is a subsequent stage of the low-pass filter, the reference leakage is not able to be removed thereafter. In the present embodiment, the pads PRFC, PPAQ, and PVSPA for outputting a transmission signal are disposed at positions away from the third side HS3, and thus in this point, it is possible to effectively reduce reference leakage from the vibrator element 30.

Figure 4:
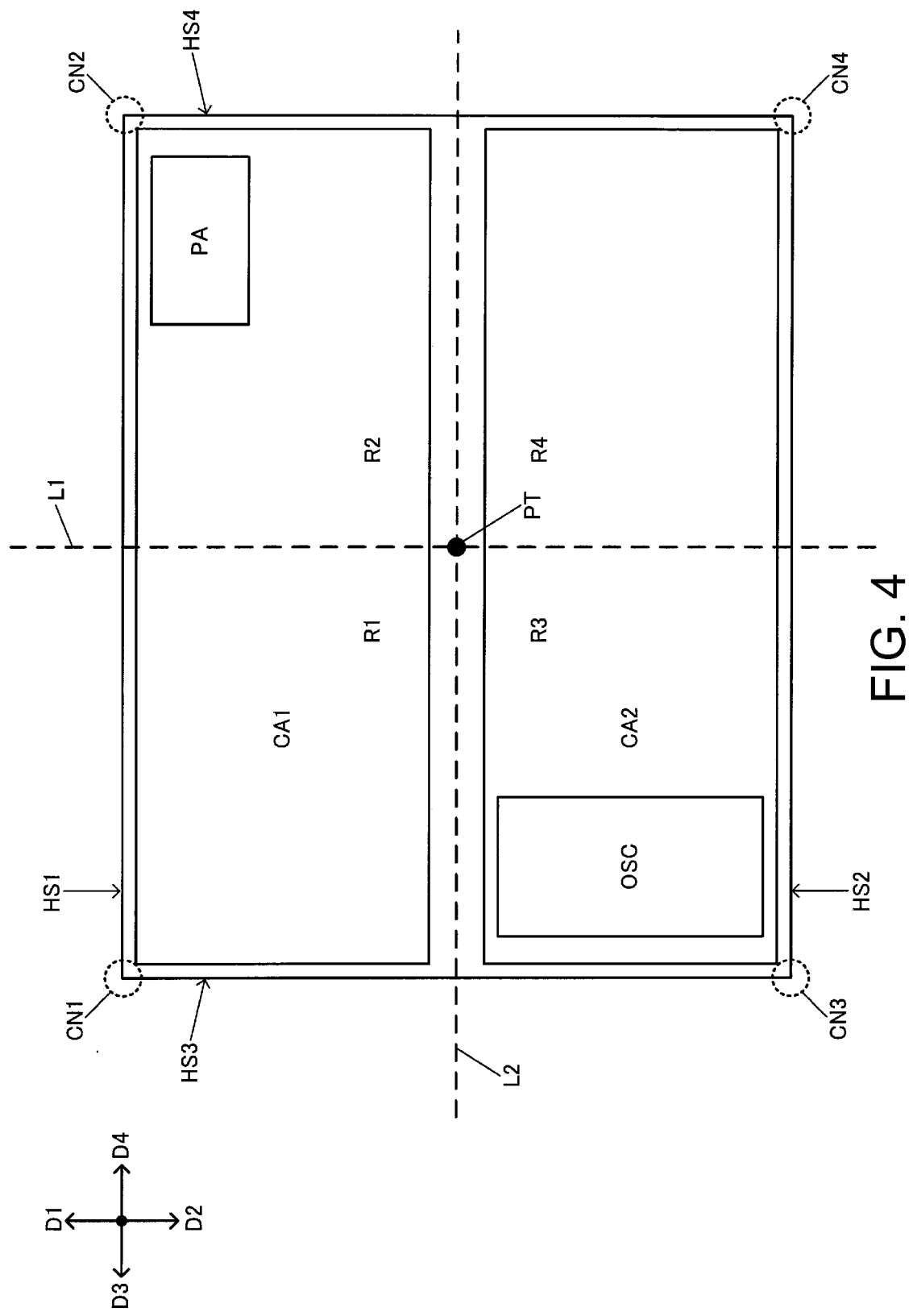
FIG. 4 is a second layout configuration example of the semiconductor device.

FIG. 4 shows a second layout configuration example of the semiconductor device. FIG. 4 is a layout when the semiconductor device 20 is seen in plan view from the surface side on which circuits are formed.

As shown in FIG. 4, in the first circuit region CA1, a buffer circuit for an analog signal is disposed in a region PA closer to a fourth side HS4 than the third side HS3 of the semiconductor device 20. In addition, in the second circuit region CA2, the oscillation circuit of the vibrator element 30 is disposed in a region OSC closer to the third side HS3 than the fourth side HS4.

The fourth side HS4 is a side extending along a direction intersecting the first side HS1 and the second side HS2, a side facing the third side HS3, and a side located in the fourth direction D4, for example, when seen from the central portion of the semiconductor device 20. The fourth direction D4 is a direction in an in-plane parallel to the substrate plane of the semiconductor device 20, a direction intersecting (for example, orthogonal to) the first direction D1 and the second direction D2, and a direction which is parallel to the third direction D3 and is opposite to the third direction D3 (directions are different from each other by 180 degrees). In a case where the semiconductor device 20 is rectangular or square in shape when seen in plan view, the fourth side HS4 is a side which is orthogonal to the first side HS1 and the second side HS2 and is parallel to the third side HS3.

The buffer circuit for an analog signal is a circuit that amplifies (buffers) an analog signal generated in the analog circuit of the semiconductor device 20 and outputs the resultant to the analog pad PANA. In the radio communication device described later in FIG. 9, the buffer circuit is equivalent to a power amplifier 220. The power amplifier 220 is a circuit that outputs a transmission signal generated in the fractional -N-type PLL circuit 210 to an antenna through the pads PRFC, PPAQ, and PVSPA.

A distance from the region PA having this buffer circuit disposed therein to the fourth side HS4 is smaller than a distance from the region PA to the third side HS3. In addition, a distance from the region OSC having the oscillation circuit disposed therein to the third side HS3 is smaller than a distance from the region OSC to the fourth side HS4. The distance can be defined variously, but the length of a perpendicular line drawn, for example, from the center of a region to each side can be set to a distance. Alternatively, the length of a perpendicular line drawn from a point closest to each side in a region to each side may be set to a distance.

Meanwhile, positional relationships between the region PA, the region OSC and the first side HS1, the second side HS2 are not particularly limited. However, considering that the region PA is provided in the first circuit region CA1, and that the region OSC is provided in the second circuit region CA2, it is preferable that the region PA be a region closer to the first side HS1 than the second side HS2, and the region OSC be a region closer to the second side HS2 than the first side HS1.

Specifically, when the semiconductor device 20 is seen in plan view, the semiconductor device 20 is demarcated by a first line L1 and a second line L2 that pass through a center PT of the semiconductor device 20 and intersect each other. The demarcated regions is a first region R1 including a corner portion CN1 at which the first side HS1 and the third side HS3 intersect each other, a second region R2 including a corner portion CN2 at which the first side HS1 and the fourth side HS4 intersect each other, a third region R3 including a corner portion CN3 at which the second side HS2 and the third side HS3 intersect each other, and a fourth region R4 including a corner portion CN4 at which the second side HS2 and the fourth side HS4 intersect each other. In this case, the oscillation circuit (region OSC) is disposed in the third region R3, and the power amplifier (region PA, buffer circuit for an analog signal) is disposed in the second region R2.

The center PT of the semiconductor device 20 can be defined variously, but is, for example, a point of intersection between a line connecting the midpoint of the first side HS1 to the midpoint of the second side HS2 and a line connecting the midpoint of the third side HS3 to the midpoint of the fourth side HS4. Alternatively, the center may be a point of intersection between the diagonal lines of a quadrangle which is constituted by the first to fourth sides HS1 to HS4.

The first line L1 is, for example, a line parallel to the first side HS1 and the second side HS2, and the second line L2 is, for example, a line parallel to the third side HS3 and the fourth side HS4. When the semiconductor device 20 is rectangular in shape, for example, the first line L1 and the second line L2 are lines orthogonal to each other. In this case, the first to fourth regions R1 to R4 become four regions equal in size. Meanwhile, the corner portions (CN1 to CN4) are points of intersection of two sides, and are corners of a quadrangle.

As described in FIG. 3, when digital noise such as reference leakage is applied to an output buffer which is an analog final stage, it is very difficult to remove the digital noise at the subsequent stage.

In this regard, in the layout of FIG. 4, the region OSC of the oscillation circuit is disposed near the third side HS3, and the region PA of the power amplifier is disposed near the fourth side HS4. Thereby, the oscillation circuit which is a generation source of digital noise and the power amplifier that performs an analog output are disposed at positions away from each other. For example, when the first side HS1 and the second side HS2 are long sides, the interval between the third side HS3 and the fourth side HS4 which are short sides is larger than the interval between the long sides. That is, the noise generation source can be disposed at a position away from the power amplifier insofar as possible.

Further, the power amplifier and the oscillation circuit are disposed in the second region R2 and the third region R3 out of the first to fourth regions R1 to R4 by which the semiconductor device 20 is demarcated (for the sake of convenience), and thus it is possible keep the noise generation source and the power amplifier at a distance in a diagonal direction. This is an arrangement having the farthest distance therebetween in the semiconductor device 20, and it can be expected that the effect of reducing reference leakage improves.

In addition, the oscillation circuit and the power amplifier are separated from each other, and thus the pads PXG and PXD which are connected to the oscillation circuit and the pads PRFC, PPAQ, and PVSPA which are connected to the power amplifier are disposed at positions away from each other in association therewith. Thereby, bonding wires which are connected to these pads extend in opposite directions, and thus the possibility of reference leakage being generated between the bonding wires can also be reduced considerably.

Meanwhile, in FIG. 4, the region (first circuit region CA1) of the analog circuit and the region (second circuit region CA2) of the digital circuit are disposed using the second line L2 as a boundary, but there is no limitation thereto. For example, as described later in FIG. 10, the region of the analog circuit and the region of the digital circuit may be separated from each other by a demarcation line rather than one straight line, and the demarcation line are not required to pass through the center of the semiconductor device 20.

4. Detailed Configuration of Package

Figure 5:
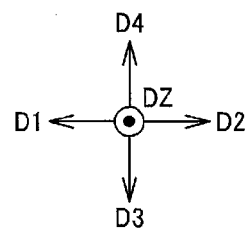
FIG. 5 is a detailed configuration example of a package in which a vibrator element and the semiconductor device are mounted.
Figure 5:
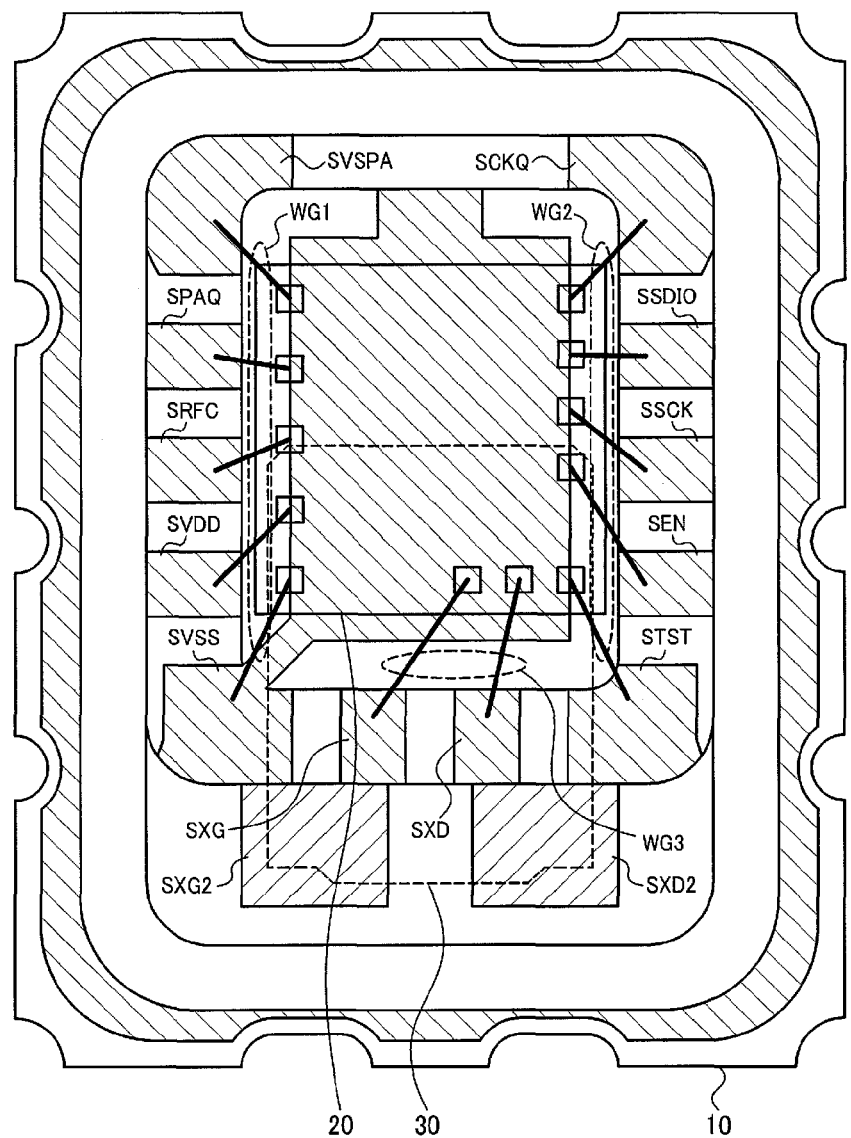
Figure 6:
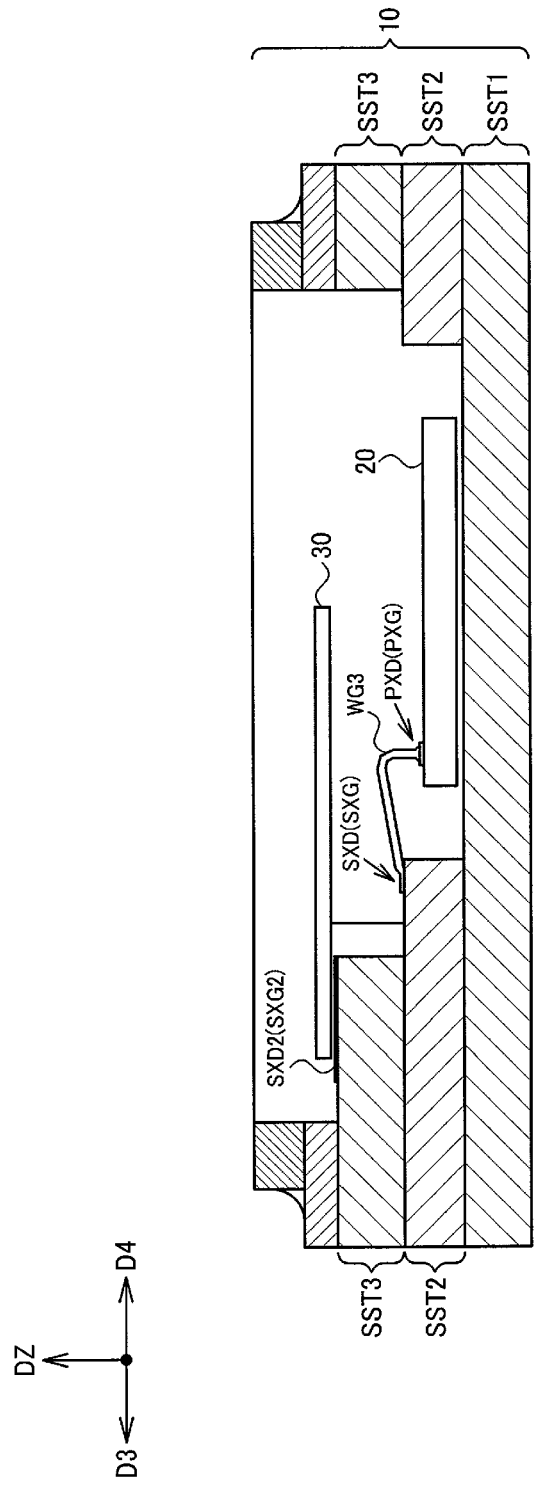
FIG. 6 is a detailed configuration example of the package in which the vibrator element and the semiconductor device are mounted.
Figure 7:
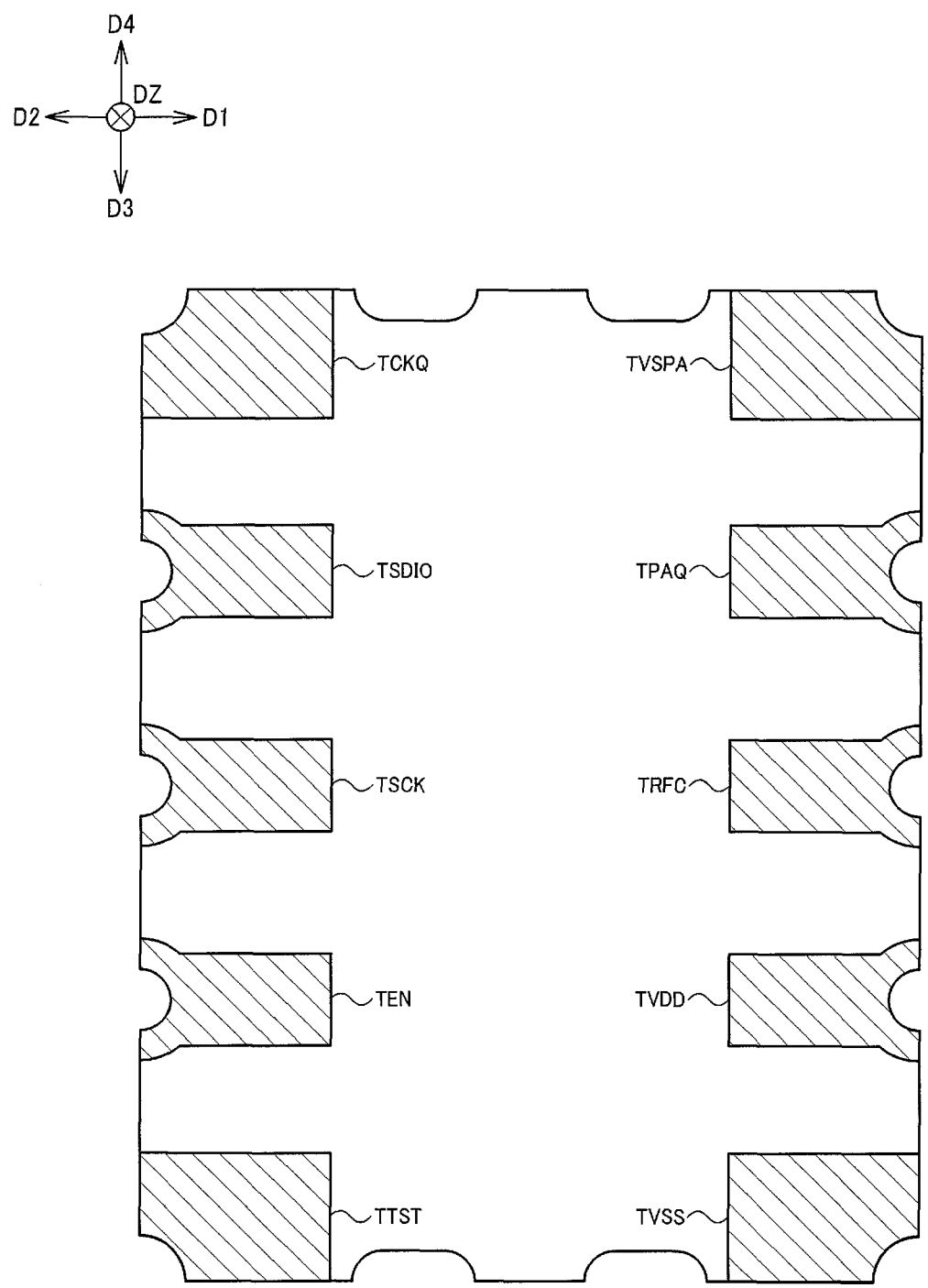
FIG. 7 is a detailed configuration example of the package in which the vibrator element and the semiconductor device are mounted.

FIGS. 5 to 7 show a detailed configuration example of the package 10 having the vibrator element 30 and the semiconductor device 20 mounted therein. FIG. 5 is a plan view diagram when the package 10 is seen from above (direction DZ), and is a plan view diagram in a state where an upper lid of the package 10 is opened. FIG. 6 is a cross-sectional view when the package 10 is seen from the second direction D2. FIG. 7 is a plan view diagram when the package 10 is seen from below (opposite direction to the direction DZ).

Here, the direction DZ is a direction perpendicular to the first to fourth directions D1 to D4, and is equivalent to the normal direction of a mounting surface when the package 10 is mounted in the circuit substrate.

As shown in FIG. 5, a first wire group WG1 for connecting the analog pad PANA to the analog terminal TANA, a second wire group WG2 for connecting the digital pad PDG to the digital terminal TDG, and a third wire group WG3 for connecting the vibrator element 30 to the pads PXG and PXD for a vibrator element are provided within the package 10.

Specifically, the first wire group WG1 connects the analog pads PVSS, PVDD, PRFC, PPAQ, and PVSPA of the semiconductor device 20 to analog electrode pads SVSS, SVDD, SRFC, SPAQ, and SVSPA which are provided in the package 10. In addition, the second wire group WG2 connects the digital pads PTST, PEN, PSCK, PSDIO, and PCKQ of the semiconductor device 20 to digital electrode pads STST, SEN, SSCK, SSDIO, and SCKQ which are provided in the package 10.

The analog electrode pads SVSS, SVDD, SRFC, SPAQ, and SVSPA, and the digital electrode pads STST, SEN, SSCK, SSDIO, and SCKQ are connected to analog terminals TVSS, TVDD, TRFC, TPAQ, and TVSPA, and digital terminals TTST, TEN, TSCK, TSDIO, and TCKQ by in-package wirings of the package 10.

In addition, the vibrator element 30 and the pads PXG and PXD for a vibrator element are connected to each other by the third wire group WG3 and the in-package wirings of the package 10.

That is, as shown in FIG. 6, the third wire group WG3 connects the pads PXG and PXD for a vibrator element of the semiconductor device 20 to first electrode pads SXG and SXD for a vibrator element which are provided in the package 10. The first electrode pads SXG and SXD for a vibrator element are connected to second electrode pads SXG2 and SXD2 for a vibrator element which are provided in the package 10 by the in-package wirings. The second electrode pads SXG2 and SXD2 for a vibrator element and the terminal of the vibrator element 30 are connected to each other by a conductive adhesive.

According to the above embodiment, the first wire group WG1 for analog use is connected to the electrode pad of the package 10 toward the outside from the first side HS1 of the semiconductor device 20, and the second wire group WG2 for digital use is connected to the electrode pad of the package toward the outside from the second side HS2 of the semiconductor device 20. Thereby, the analog bonding wire and the digital bonding wire run away toward opposite directions, and the preceding electrode pads, and the package wirings for connecting the electrode pads and terminals are also provided at positions farther away from each other by separation into digital and analog parts.

In addition, the third wire group WG3 for a vibrator element is connected to the electrode pad of the package 10 toward the outside from the third side HS3 of the semiconductor device 20. Thereby, the bonding wire for a vibrator element runs away from the analog bonding wire (wires do not intersect each other, but directions intersect each other), and the preceding electrode pads, and the package wirings for connecting the electrode pads and terminals also run away from the analog electrode pads and the package wirings.

In this manner, the analog signal, the digital signal, and the signal of the vibrator element run away from each other toward the outside with the semiconductor device 20 as a starting point, and coupling between the analog signal and the digital signal is very difficult to occur in the inside and outside of the package 10.

In addition, the in-package wirings for connecting the vibrator element 30 to the pads PXG and PXD for a vibrator element are provided, and thus it is possible to efficiently dispose the semiconductor device 20 and the vibrator element 30 within the package 10, and to realize a reduction in the size of (reduction in the mounting area of) the package 10. Specifically, a three-dimensional arrangement within the package 10 can be performed as described below.

That is, as shown in FIGS. 5 and 6, the vibrator element 30 is disposed in the package 10 so as to overlap the semiconductor device 20 when the package is seen in plan view.

Specifically, the vibrator element 30 and the semiconductor device 20 are different from each other in height (position in the direction DZ) from the bottom of the package 10, and the vibrator element 30 is disposed so as not to come into contact with the semiconductor device 20. In FIG. 6, the vibrator element 30 can vibrate. When seen in plan view, how much the vibrator element 30 and the semiconductor device 20 overlap each other is arbitrary, but the arrangement regions (PA of FIG. 4) of the vibrator element 30 and the power amplifier of the semiconductor device 20 are disposed so as not to overlap each other, for example, when seen in plan view. Meanwhile, the degree of overlapping is not limited thereto. As shown in FIG. 5, the vibrator element 30 may overlap a portion of the semiconductor device 20, and the vibrator element 30 may overlap the entirety of the semiconductor device 20. In addition, basically, a portion of the vibrator element 30 which overlaps the semiconductor device 20 is partial, but there is no limitation thereto.

A difference in height at which the vibrator element 30 and the semiconductor device 20 are disposed is realized by the formation of a ceramic sheet. For example, a sheet SST1 of a first layer for installing the semiconductor device 20 is provided, a sheet SST2 of a second layer and a sheet SST3 of a third layer, having a frame shape, which surround the semiconductor device 20 are provided on the sheet SST1 of the first layer, and the vibrator element 30 is installed on the sheet SST3 of the third layer. The first electrode pads SXD and SXG for a vibrator element are provided on, for example, the sheet SST2 of the second layer, and in-sheet wirings are provided from the first electrode pads to the second electrode pads SXD2 and SXG2 on the sheet SST3 of the third layer.

In this manner, the vibrator element 30 and the semiconductor device 20 can be disposed so as to overlap each other when seen in plan view, and thus it is possible to form the vibrator element 30 into one package and to reduce the size of the mounting area of the package 10. In addition, wiring between the vibrator element 30 and the semiconductor device 20 is simple (routing is small) even while the vibrator element 30 is built-in, which leads to contribution to a reduction in crosstalk within the package 10. In addition, a wiring through which an oscillation signal is passed is not required to be provided on the mounting substrate by the vibrator element 30 being formed into one package. As a wiring becomes longer, radiation from the wiring tends to increase. Therefore, the capability of transfer of the oscillation signal using a short wiring within the package 10 contributes to a reduction in EMC noise which is radiated from the wiring for the oscillation signal.

In addition, in a case where the arrangement regions of the vibrator element 30 and the power amplifier of the semiconductor device 20 are disposed so as not to overlap each other when seen in plan view, it is possible to reduce a decrease in the accuracy of the oscillation frequency of the vibrator element 30. That is, the power amplifier outputs a large current vibrating at the frequency of radio communication, and thus there is the possibility of influencing the vibration of the vibrator element 30 due to noise generated therefrom. For this reason, when the vibrator element 30 and the semiconductor device 20 are formed into one package, there is the possibility of the accuracy of the oscillation frequency of the vibrator element 30 decreasing. In this regard, since an influence from the power amplifier can be made as small as possible by causing the vibrator element 30 not to overlap the power amplifier when seen in plan view, it is possible to perform the formation thereof into one package while reducing a decrease in the accuracy of the oscillation frequency of the vibrator element 30.

Meanwhile, in the package 10, an inspection terminal (not shown) of the vibrator element 30 may be provided on a third side HK3 of the package.

For example, an inspection terminal which is connected to an electrode pad for a vibrator element (such as, for example, SXD2) by the in-package wiring may be provided on the third side of the package located on the lateral side of the package 10. In this case, it is possible to test an oscillation signal of the oscillation circuit (check, for example, an amplitude, a frequency or the like) from the inspection terminal of the oscillation signal, using a test device such as a network analyzer. Alternatively, a signal having passed through some kind of circuit (such as, for example, a buffer or a frequency divider) within the semiconductor device 20 may be connected to the inspection terminal without extracting the oscillation signal directly.

5. System Configuration Example

Figure 8:
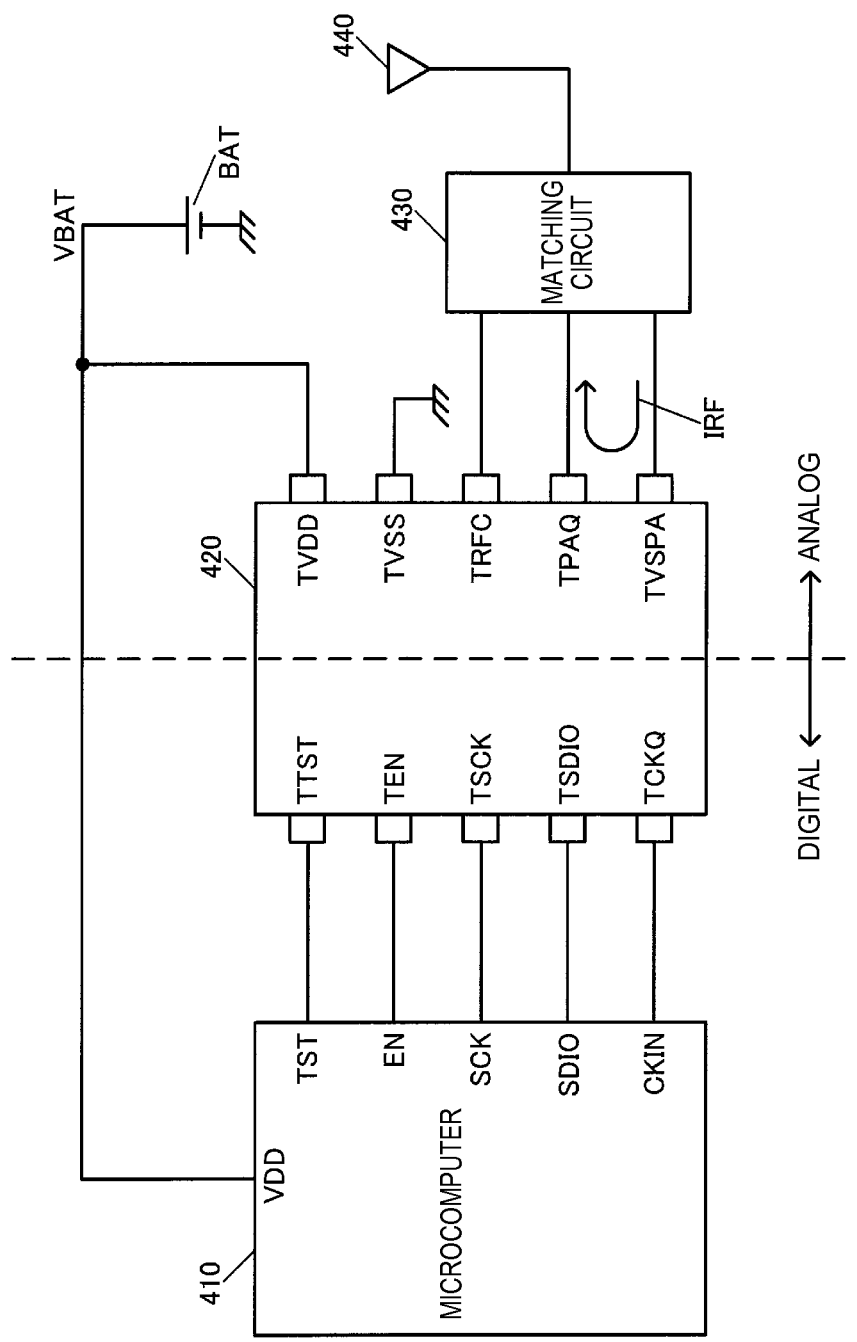
FIG. 8 is a configuration example of a system to which a radio communication device of the present embodiment is applied.

FIG. 8 shows a configuration example of a system to which the radio communication device of the present embodiment described above is applied. The system of FIG. 8 includes a microcomputer 410, a radio communication device 420, a matching circuit 430, an antenna 440, and a battery BAT (power supply or battery). This system is, for example, a radio transmitter (RF transmitter).

The configurations and operations of the microcomputer 410, the matching circuit 430, and the antenna 440 are the same as those of the microcomputer MC, the matching circuit IMT, and the antenna ANN of the comparative example of FIG. 1, and thus the description thereof will be omitted appropriately.

The digital terminals TTST, TEN, TSCK, TSDIO, and TCKQ of the radio communication device 420 are terminals which are connected to an external control controller.

In the example of FIG. 8, the external control controller is the microcomputer 410. That is, the external control controller is a digital processing circuit that performs a process or an input and output of a digital signal (binary signal of an H level and an L level), and is a controller (host controller) that supplies communication data to the radio communication device 420 and performs control of radio communication.

As shown in FIG. 8, the microcomputer 410 is mounted facing a side (second side HK2 of the package) on which a digital terminal of the radio communication device 420 is provided. On the other hand, the matching circuit 430 or the antenna 440 (for example, pattern antenna formed by a wiring pattern of a printed substrate) is mounted facing a side (first side HK1 of the package) on which an analog terminal of the radio communication device 420 is provided.

Such a mounting arrangement can be performed by separating the digital terminal and the analog terminal into two sides. That is, a digital unit and an analog unit can be clearly separated (separated from side to side in FIG. 8) from the semiconductor device 20 within the radio communication device 420 to the upper portion of the mounting substrate outside the package. The wirings on the mounting substrate are just configured to be connected from the microcomputer 410 to a digital terminal of a facing side, and to be connected from the matching circuit 430 to an analog terminal of a facing side, and thus wiring routing on the mounting substrate is very simple. From the above, in spite of the establishment of a condition in which crosstalk normally tends to be generated due to a reduction in size, in the present embodiment, it is possible to construct a wireless communication system having a very small scope in which crosstalk between digital and analog signals is generated.

In addition, in the comparative example of FIG. 1, the wiring of the clock terminal CKOUT and the wiring of the radio transmission terminal GNDPA are located next to each other, which results in the cause of reference leakage. In this regard, in the present embodiment, since the digital and analog parts are completely separated from each other, a case does not occur in which the wiring of the clock terminal TCKQ and the wirings of the radio transmission terminals TRFC, TPAQ, and TVSPA come close to each other. Thereby, reference leakage is reduced, and thus it can be expected that a design satisfying laws and regulations of radio communication is facilitated.

In addition, in the radio communication device 420 of the present embodiment, the transmission signal output terminal TPAQ for radio output and the ground terminal TVSPA for radio output are disposed adjacent to each other.

When radio transmission is performed, for example, like a current IRF shown in FIG. 8, a current flowing to the wiring of the transmission signal output terminal TPAQ and a current flowing to the wiring of the ground terminal TVSPA are opposite to each other in direction. In this case, a magnetic field based on a current is intensified between two wirings, and a magnetic field is canceled outside the two wirings. That is, a smaller loop which is formed by two wirings has less radiation due to the vibration of the current IRF, and thus it is possible to suppress radiation which is generated outside the antenna 440. In the present embodiment, the size of the above loop can be reduced by two terminals being adjacent to each other.

In addition, the loop is a kind of antenna, and there is the possibility of digital noise generated by the radio communication device 420 or the like being collected. When the loop becomes smaller, the possibility of digital noise being collected becomes lower, and thus it is also possible to prevent the digital noise from being sent out from the antenna 440 as unnecessary radiation. As the digital noise, the oscillation signal or the like is considered to be an example. As described above, unnecessary radiation of the oscillation signal is reduced by the vibrator element 30 being built into the package, and it is expected to be helpful to a reduction in reference leakage in accordance with a reduction in the size of the above loop.

6. Detailed Circuit Configuration of Semiconductor Device

Figure 9:
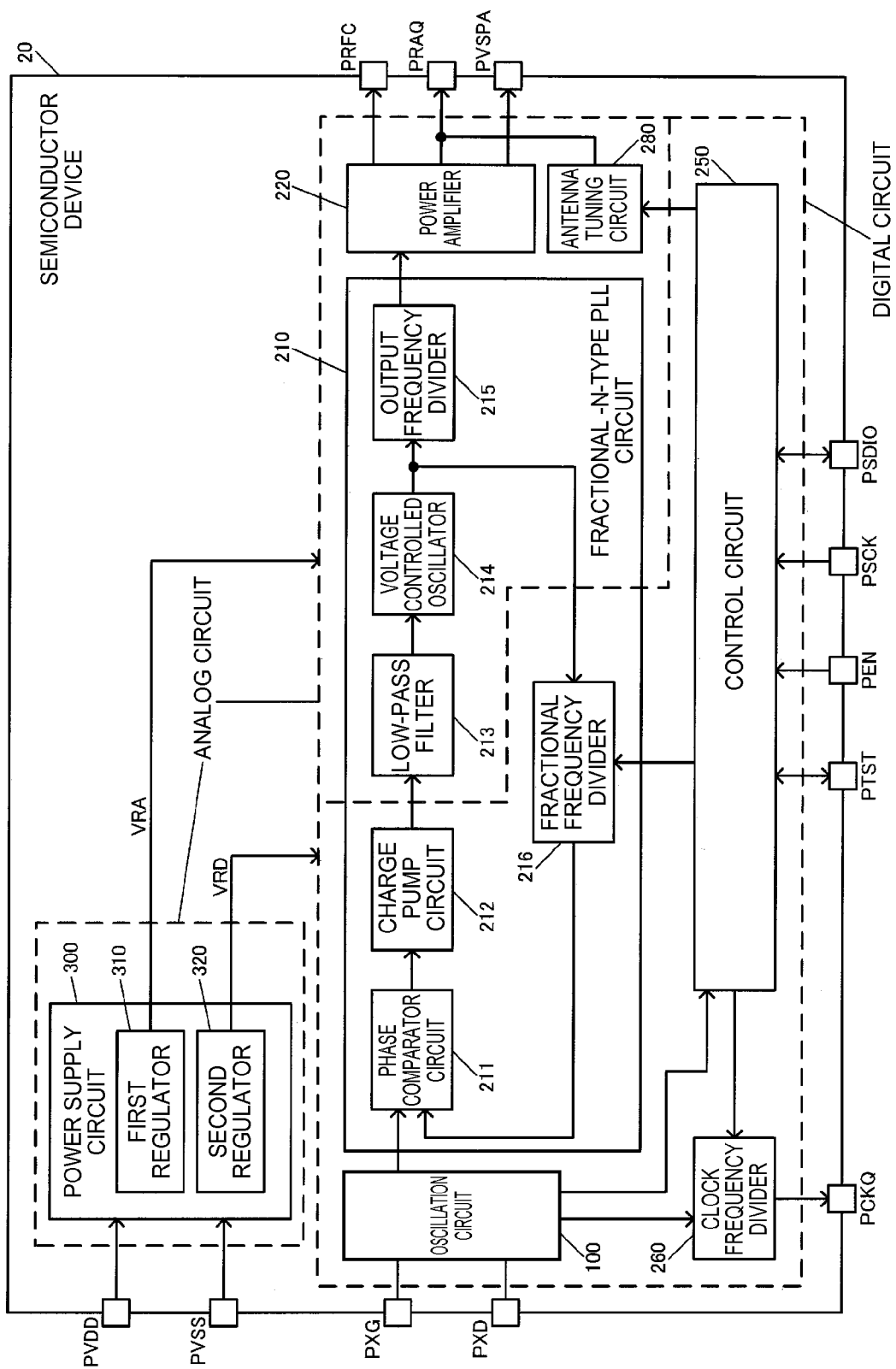
FIG. 9 is a functional block diagram of a detailed configuration example of the semiconductor device.

FIG. 9 shows a functional block diagram of a detailed configuration example of the semiconductor device 20. The semiconductor device 20 includes an oscillation circuit 100 of a vibrator element, and a radio communication circuit that performs a radio communication process on the basis of an oscillation signal from the oscillation circuit 100. The radio communication circuit includes a fractional -N-type PLL circuit 210, a power amplifier 220, a control circuit 250, and an antenna tuning circuit 280. In addition, the semiconductor device 20 includes a clock frequency divider 260 and a power supply circuit 300.

The fractional -N-type PLL circuit 210 generates a carrier wave signal by performing fraction multiplication (including integer multiplication) using the oscillation signal from the oscillation circuit 100 as a reference clock signal, and generates a radio transmission signal by modulating the carrier wave signal.

Specifically, the fractional -N-type PLL circuit 210 includes a phase comparator circuit 211, a charge pump circuit 212, a low-pass filter 213, a voltage controlled oscillator 214 (VCO), an output frequency divider 215, and a fractional frequency divider 216 (feedback frequency divider).

The phase comparator circuit 211 compares the phase of a reference clock with the phase of a PLL oscillation signal which is fed back through the fractional frequency divider 216, and outputs a voltage signal based on a phase difference therebetween. The charge pump circuit 212 converts the voltage signal from the phase comparator circuit 211 into a current signal. The low-pass filter 213 converts the current signal from the charge pump circuit 212 into a voltage signal and performs a low-pass filter process. The voltage controlled oscillator 214 oscillates at a frequency according to the voltage value from the low-pass filter 213. The fractional frequency divider 216 frequency-divides the PLL oscillation signal from the voltage controlled oscillator 214 at the division ratio of a fraction (integer+decimal). The fraction multiplication of the reference clock can be performed by this fraction division.

The division ratio of a fraction is determined, for example, as follows. That is, the fractional frequency divider 216 includes a frequency divider capable of switching a plurality of integer division ratios, and a delta-sigma modulator. The delta-sigma modulator generates a switching signal in which an average value is equal to a desired fraction through delta-sigma modulation, and switches a plurality of integer division ratios using the switching signal. For example, when N division and N+1 division are switched at a ratio of 1:1, a fraction division ratio of N+0.5 is established as an average.

The output frequency divider 215 frequency-divides the PLL oscillation signal from the voltage controlled oscillator 214, and outputs the resultant as a radio transmission signal. That is, the frequency of the signal which is output by the output frequency divider 215 serves as a carrier frequency.

The antenna tuning circuit 280 is a circuit for maximizing (optimizing) the output power of the radio transmission signal. For example, since manufacturing variation is present in the semiconductor device 20, an individual difference occurs in the output power when the antenna is connected, but the antenna tuning circuit 280 adjusts the individual difference (for example, adjustment in a manufacturing process). The antenna tuning circuit 280 is constituted by, for example, a variable capacitor and the like, and adjusts the capacitance value of a variable capacitor so that the output power of the radio transmission signal becomes maximum. Meanwhile, the antenna tuning circuit 280 may be omitted.

In order to perform radio communication, the above carrier wave is required to be modulated, but modulation is performed, for example, as follows. That is, the control circuit 250 receives transmission data from the microcomputer 410, and modulates the division ratio of the fractional frequency divider 216 on the basis of the transmission data. Thereby, the oscillation frequency (multiplication ratio) of PLL is modulated, and thus radio communication based on so-called FSK modulation can be performed.

In radio communication, frequencies used in communication based on, for example, laws and regulations of individual countries are different from each other. For this reason, carrier waves of a large number of frequencies are required to be generated, and in the past, a combination of quartz crystal resonators having different oscillation frequencies has been used in response to the frequency of carrier wave. For this combination, an external quartz crystal resonator has been required to be used. In this regard, in the present embodiment, the fractional -N-type PLL circuit 210 is used, and thus carrier waves of a large number of frequencies can be generated by fraction multiplication even in a case of the quartz crystal resonator having the same oscillation frequency. Thereby, the vibrator element 30 and the semiconductor device 20 can be formed into one package.

However, as the size of the device is reduced by the formation into one package, it is more difficult to remove crosstalk between digital and analog signals. In this regard, according to the present embodiment, the circuit regions, pads, and terminals are separated from each other at different sides by separation into digital and analog parts, and crosstalk between digital and analog signals is not likely to be generated in the inside and outside of the package 10. In this manner, in the present embodiment, both the formation into one package and the reduction of crosstalk are realized.

Next, the power supply circuit 300 will be described. The power supply circuit 300 generates a power supply voltage which is used inside the semiconductor device 20, on the basis of a power supply voltage supplied from an external system power supply (such as, for example, a battery) of the semiconductor device 20. Specifically, the power supply circuit 300 includes a first regulator 310 that supplies an analog power supply voltage VRA to the analog circuit, and a second regulator 320 that supplies a digital power supply voltage VRD to the digital circuit.

The first regulator 310 and the second regulator 320 are, for example, linear regulators that drop the power supply voltage from the system power supply. The analog power supply voltage VRA is supplied by a first power supply line from the first regulator 310 to the analog circuit. In addition, the digital power supply voltage VRD is supplied by a second power supply line from the second regulator 320 to the digital circuit. The first power supply line and the second power supply line are wired separately from each other.

A voltage fluctuation occurs in the digital power supply voltage VRD due to an operation of the digital circuit. When the voltage fluctuation is coupled to the analog power supply voltage VRA, the trembling thereof is transferred to the analog signal through the analog circuit, and the digital noise of the analog signal may occurs. In this regard, according to the present embodiment, the first regulator 310 for analog use and the first power supply line, and the second regulator 320 for digital use and the second power supply line are separated from each other, and thus the analog power supply voltage VRA and the digital power supply voltage VRD are electrically separated from each other. Thereby, it is possible to reduce crosstalk (coupling of noise) between digital and analog signals through the power supply voltage (power supply line).

More specifically, the first regulator 310 supplies the analog power supply voltage VRA to the low-pass filter 213, the voltage controlled oscillator 214, the output frequency divider 215, and the power amplifier 220. In addition, the second regulator 320 supplies the digital power supply voltage VRD to the phase comparator circuit 211, the charge pump circuit 212, the fractional frequency divider 216, the oscillation circuit 100, the control circuit 250, and the clock frequency divider 260.

That is, in the present embodiment, the low-pass filter 213, the voltage controlled oscillator 214, the output frequency divider 215, the power amplifier 220, the antenna tuning circuit 280, and the power supply circuit 300 are classified as the analog circuit. In addition, the phase comparator circuit 211, the charge pump circuit 212, the fractional frequency divider 216, the oscillation circuit 100, the control circuit 250, and the clock frequency divider 260 are classified as the digital circuit.

Crosstalk between digital and analog signals can be reduced by this classification, which is particularly effective in the reduction of reference leakage. The noise source of reference leakage is a circuit operating at a reference clock, and the respective units classified as the above digital circuit are equivalent thereto. As to the fractional -N-type PLL circuit 210, the phase comparator circuit 211, the charge pump circuit 212, and the fractional frequency divider 216 perform digital operations at the frequency of the reference clock (or, clock obtained by frequency-dividing the reference clock). First, power supplies of these components are separated from the analog circuit, thereby allowing reference leakage through a power supply to be reduced.

In addition, even when noise of the reference clock is coupled at the preceding stage of the low-pass filter 213, the cutoff frequency of the low-pass filter 213 is made lower than the frequency of the reference clock, thereby allowing reference leakage to be cut. However, when the noise of reference clock is coupled at the subsequent stage of the low-pass filter 213, no filter is present in the further subsequent stage, and thus it is very difficult to remove the reference leakage. In this regard, in the present embodiment, the subsequent stage of the low-pass filter 213 is classified as the analog circuit, and the power supply is separated from the digital circuit. Thereby, crosstalk through the power supply can be prevented from being generated in the subsequent stage of the low-pass filter 213 which is not likely to remove reference leakage.

The crosstalk through the power supply is coupled to the analog circuit through not only the power supply line but also the substrate, and thus has a lot of influence on a wide range. For this reason, the power supplies are separated from each other by performing the classification as described above, and thus the reference leakage can be reduced very effective as compared to a case where power supply separation is not performed.

Meanwhile, the output frequency divider 215 operates in a digital manner, but is an analog component in the meaning that digital noise is carried on a wireless analog output when the digital noise is coupled to the output frequency divider 215. That is, the analog circuit and the digital circuit are defined in view of the influence of crosstalk on the analog signal rather than merely a digital operation or an analog operation.

7. Detailed Layout Configuration of Semiconductor Device

Figure 10:
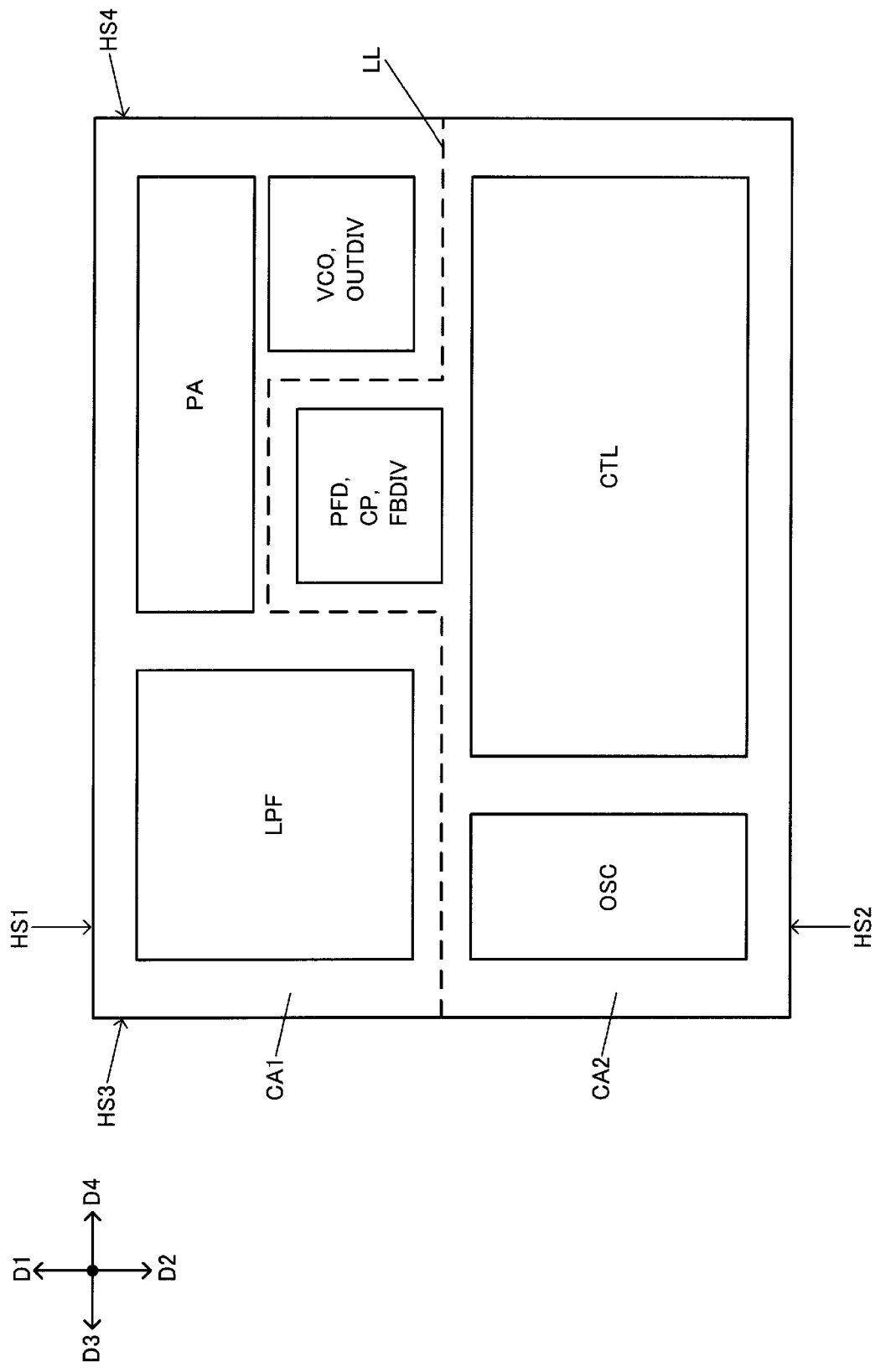
FIG. 10 is a detailed layout configuration example of the semiconductor device.

FIG. 10 shows a detailed layout configuration example of the semiconductor device 20 in the above configuration example.

The first circuit region CA1 on the first side HS1 includes a region VCO having the voltage controlled oscillator 214 disposed therein, a region OUTDIV having the output frequency divider 215 disposed therein, the region PA having the power amplifier 220 disposed therein, and a region LPF having the low-pass filter 213 disposed therein.

In addition, the second circuit region CA2 on the second side HS2 includes a region PFD having the phase comparator circuit 211 disposed therein, a region CP having the charge pump circuit 212 disposed therein, a region FBDIV having the fractional frequency divider 216 disposed therein, a region OSC having the oscillation circuit 100 disposed therein, and a region CTL having the control circuit 250 disposed therein. Meanwhile, a memory or the like may be disposed in the region CTL, in addition to the control circuit 250 which is constituted by, for example, a gate array.

As described in FIG. 4, the power amplifier 220 (PA) and the oscillation circuit 100 (OSC) are disposed spaced apart in a diagonal line. In the first circuit region CA1, the low-pass filter 213 (LPF) is disposed on the third direction D3 side (third side HS3) when seen from the power amplifier 220. In addition, the voltage controlled oscillator 214 and the output frequency divider 215 (VCO, OUTDIV) are disposed on the second direction D2 side (second side HS2) when seen from the power amplifier 220. In the second circuit region CA2, the control circuit 250 (CTL) is disposed in the fourth direction D4 (fourth side HS4) when seen from the oscillation circuit 100. In addition, the phase comparator circuit 211, the charge pump circuit 212, and the fractional frequency divider 216 (PFD, CP, FBDIV) are disposed on the first direction D1 side (first side HS1) when seen from the control circuit 250.

A boundary line LL between the first circuit region CA1 and the second circuit region CA2 is aline wrapping around the regions PFD, CP, and FBDIV. This boundary line LL is not limited to one straight line, and the boundary line LL may be a line that intersects the third side HS3 and the fourth side HS4, and does not come into contact with the first side HS1 and the second side HS2.

With such an arrangement, the analog circuit and the digital circuit which are classified in FIG. 9 can also be separated from each other on the layout. That is, the parallel running of the wirings or the coupling of digital noise through the substrate is reduced, and thus it is possible to reduce reference leakage.

In addition, the low-pass filter 213 is mainly constituted by passive elements such as capacitors or resistors, and thus is considered to be more resistant to the wraparound of noise from the substrate than the power amplifier 220, the voltage controlled oscillator 214, or the like. For this reason, in the first circuit region CA1, the power amplifier 220 or the voltage controlled oscillator 214 is disposed farther away from the oscillation circuit 100 than the low-pass filter 213, and thus digital noise caused by the oscillation circuit 100 is not extremely coupled to a radio output.

8. Oscillation Circuit

Figure 11:
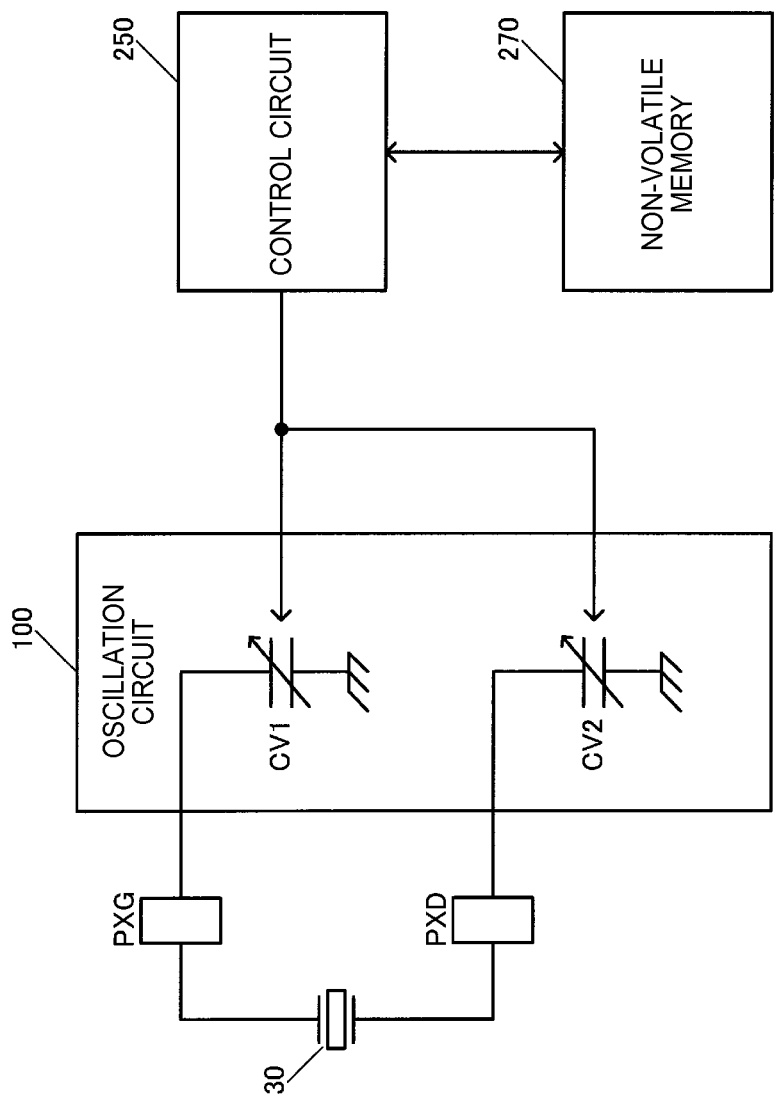
FIG. 11 is a detailed configuration example of an oscillation circuit.

FIG. 11 shows a detailed configuration example of the oscillation circuit 100. The oscillation circuit 100 includes variable capacitors CV1 and CV2 for frequency adjustment of an oscillation signal. In addition, the semiconductor device 20 includes a non-volatile memory 270 (such as, for example, an EEPROM) that stores setting values of the variable capacitors CV1 and CV2, in addition to the components of FIG. 9.

The setting values which are stored in the non-volatile memory 270 are read out by the control circuit 250, and the control circuit 250 controls the capacitance values of the variable capacitors CV1 and CV2 on the basis of the setting values. The setting values of the variable capacitors CV1 and CV2 are written in the non-volatile memory 270, for example, during manufacturing of the radio communication device 420 (during test of the oscillation frequency).

In quartz crystal resonators which are commercially available, generally, a frequency error of approximately ±50 ppm is guaranteed. This frequency error is guaranteed when an oscillating capacitor of a capacitance value (for example, 12 pF) specified in a specification is used. A user employs a combination of a quartz crystal resonator and a radio communication IC with reference to this specification. When such general-purpose components are combined, the completed body of the quartz crystal resonator is used. Therefore, when the completed body is combined with the radio communication IC, it is difficult to tune an oscillation frequency later.

Since an error of the oscillation frequency becomes a frequency error of the carrier wave, the receiving side requires receiving bands enough to permit the frequency error. That is, in a state where a frequency error of the quartz crystal resonator is large, the receiving band also has to be taken wide. It is known that when the receiving band is widened, receiving sensitivity decreases. In order to maintain radio communication of the same sensitivity at the same distance, transmission power is required to be made larger as the receiving band becomes wider.

In this regard, according to the present embodiment, the vibrator element 30 and the semiconductor device 20 (radio communication IC) are formed into one package, and thus frequency tuning in a combination thereof can be performed. That is, after the vibrator element 30 and the semiconductor device 20 are mounted in the package 10, and before a lid of the package 10 is closed, for example, the clock signal of the terminal TCKQ is probed. In order that the frequency thereof is set to be within a desired error range, for example, the vibrator element 30 is irradiated with an ion beam, thereby allowing the oscillation frequency to be adjusted.

Further, even after the package 10 is sealed, the tuning of the oscillation frequency can be performed by the adjustment of the variable capacitors CV1 and CV2. Thereby, it is possible to obtain a reference clock having a very small error as compared to components of the related art, and to reduce the frequency error of the carrier wave. Accordingly, it is possible to narrow the receiving band, and to increase the receiving sensitivity. That is, it is possible to maintain radio communication of the same sensitivity at the same distance even when transmission power is reduced, and to reduce power consumption due to a reduction in transmission power. In a portable wireless system, a small-sized battery is generally used, and a reduction in power consumption is important.

As described above, the fractional -N-type PLL circuit 210 is mounted, and the vibrator element 30 is formed into one package, whereby it is possible to realize not only a reduction in the size of a device, but also a reduction in power consumption in radio communication.

Meanwhile, even when an error is present in the oscillation frequency of a quartz crystal vibrator element, it is possible to reduce the frequency error of the carrier wave by adjusting the division ratio of the fractional -N-type PLL circuit 210. However, the division ratio is required to be adjusted for each quartz crystal vibrator element. In addition, considering that the division ratio is changed in order to create a large number of carrier frequencies, the division ratio is used in modulation, or the like, it is not realistic to individually adjust the division ratio. In this regard, in the present embodiment, it is possible to reduce the error itself in the oscillation frequency of the quartz crystal vibrator element.

9. Electronic Apparatus

Figure 12:
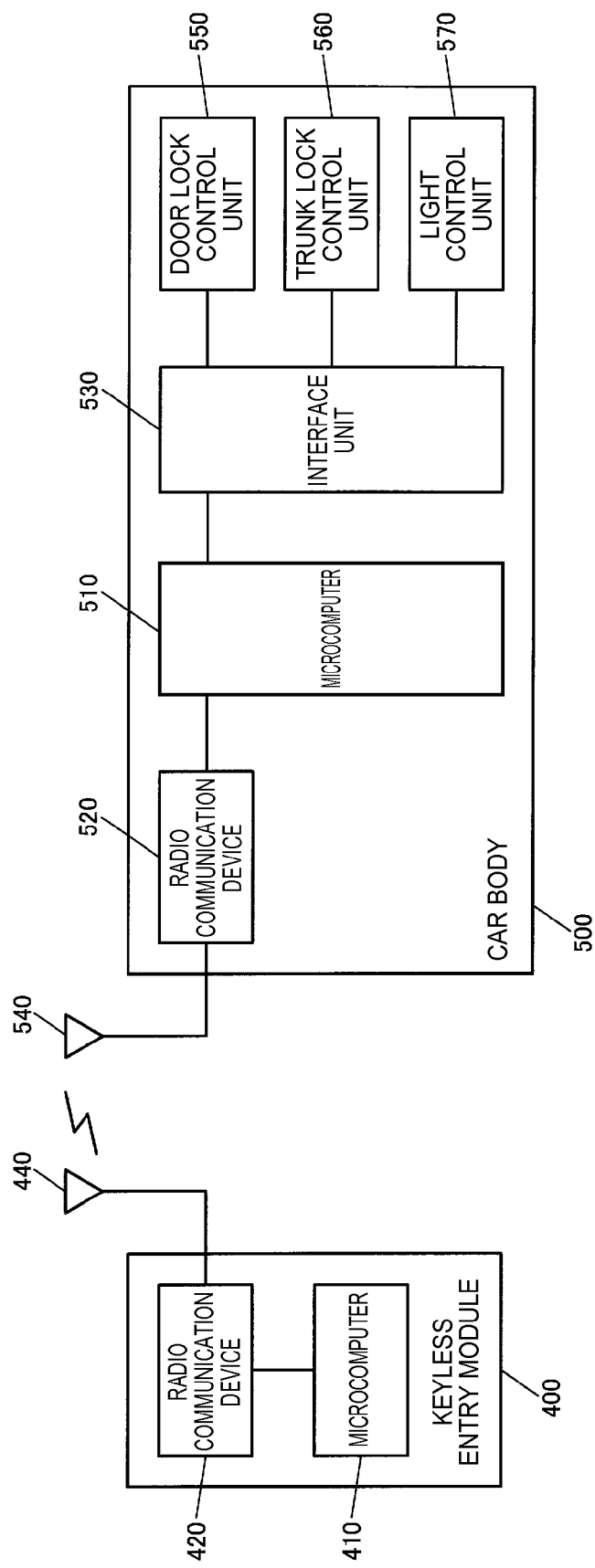
FIG. 12 is a system configuration example including an electronic apparatus.

FIG. 12 shows a system configuration example including an electronic apparatus to which the radio communication device of the present embodiment is applied. Hereinafter, a case where the electronic apparatus is a keyless entry module is taken as an example, and a keyless entry system including the keyless entry module will be described, but the radio communication device of the present embodiment can be applied to various electronic apparatuses without being limited thereto.

The keyless entry system includes a keyless entry module 400 (electronic apparatus) and a car body 500. The keyless entry module 400 includes a transmitting antenna 440, a radio communication device 420 (radio transmission device) that transmits radio waves through the antenna 440, and a microcomputer 410 that controls radio transmission. The car body 500 includes a receiving antenna 540, a radio communication device 520 (radio receiving device or RF receiver) that receives radio waves through the antenna 540, a microcomputer 510 that controls a process or the like based on radio reception or received data, an interface unit 530 that connects the microcomputer 510 to each portion of the car body 500, a door lock control unit 550 that controls locking and unlocking of a door, a trunk lock control unit 560 that controls locking and unlocking of a trunk, and a light control unit 570 that controls switching-on, switching-off, blinking or the like of a light (such as, for example, a blinker light or a headlight).

The keyless entry module 400 is provided with a button (not shown) and the like, and when a user operates the button, the car body 500 side is notified of the operation information by radio communication. The microcomputer 510 analyzes the operation information, and performs locking and unlocking of a door or a trunk, blinking of a blinker light for notifying a user of the locking and unlocking, or the like.

10. Moving Object

Figure 13:
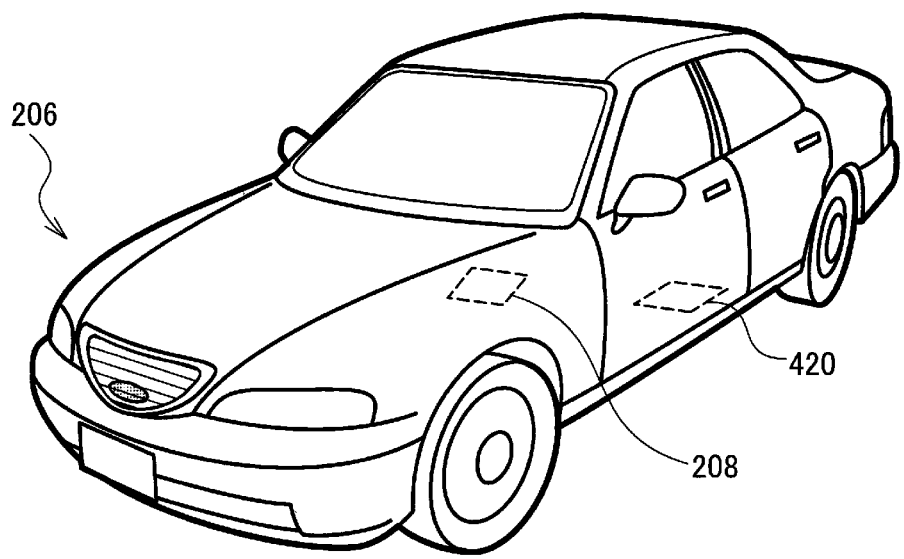
FIG. 13 is a configuration example of a moving object.

FIG. 13 shows an example of a moving object including the radio communication device 420 of the present embodiment. The radio communication device 420 of the present embodiment can be incorporated into various moving objects such as, for example, a car, an airplane, a motorcycle, a bicycle, or a vessel. The moving object is an apparatus or a device traveling on the ground, the sky, or the sea, inclusive of a drive mechanism such as, for example, an engine or a motor, a steering mechanism such as a handle or a steering wheel, and various types of electronic apparatus.

FIG. 13 schematically shows an automobile 206 as a specific example of the moving object. The radio communication device 420 including the vibrator element 30 and the semiconductor device 20, and an ECU (Electronic Control Unit) 208 that controls each portion (such as, for example, an engine, a brake, an air conditioner, or an electric-powered window) of the automobile 206 are incorporated into the automobile 206. A separate radio communication device is also connected to the ECU 208, and the ECU 208 performs control of the automobile 206 on the basis of information which is received from the radio communication device 420. Alternatively, the control information is transmitted from the ECU 208 to the radio communication device 420, and the operation of an apparatus which is connected to the radio communication device 420 is controlled. For example, some kind of sensing signal of room temperature or the like may be acquired and may be transmitted from the radio communication device 420 to the ECU 208, or an instruction for door lock release or the like may be transmitted from the ECU 208 to the radio communication device 420. In this manner, communication with no harness can be performed by using radio communication, and communication of jumping over a movable portion having difficulty in harness installation, the omission of harness installation work in a manufacturing process, and the like can be achieved.

Although the present embodiment has been described as above in detail, it can be easily understood by a person skilled in the art that various modifications without substantially departing from the new matters and effects of the invention are possible. Therefore, these modifications are all included in the scope of the invention. For example, in the specification or the drawings, the terminologies which are mentioned at least once along with different terminologies which have broader senses or the same meanings may be replaced with different terminologies in any location of the specification or the drawings. All combinations of the present embodiment and modification examples are included in the scope of the invention. In addition, the configurations and operations of the vibrator element, the semiconductor device, the package, the radio communication device, the electronic apparatus, the moving object, and the like are also not limited to those described in the present embodiment, and may have various modifications.

The entire disclosure of Japanese Patent Application No. 2014-147879, filed Jul. 18, 2014 is expressly incorporated by reference herein.

What is claimed is:

1. A circuit device comprising:
   a semiconductor device, the semiconductor device including:
     a first circuit region constituted by an analog circuit and a buffer circuit, the first circuit region having first, second, third, and fourth sides, the first and second sides being opposite to each other, the third and fourth sides being opposite to each other, the first and second sides intersecting the third and fourth sides;
     a second circuit region constituted by a digital circuit and an oscillation circuit, the second circuit region having first, second, third, and fourth sides, the first and second sides being opposite to each other, the third and fourth sides being opposite to each other, the first and second sides intersecting the third and fourth sides, wherein the second side of the first circuit region is located closer to the first side of the second circuit region than the second side of the second circuit region, and wherein the third side of the first circuit region is located closer to the third side of the second circuit region than the fourth side of the second circuit region, and the fourth side of the first circuit region is located closer to the fourth side of the second circuit region than the third side of the second circuit region;
     an analog pad being provided along the first side in the first circuit region; and
     a digital pad being provided along the second side in the second circuit region; and
   a package having the semiconductor device stored therein, the package having first and second sides opposite to each other, the first side of the package being located closer to the first side of the first circuit region than the second side at the first circuit region, the second side of the package being located closer to the second side of the second circuit region than the first side of the second circuit region, the package including:
     an analog terminal which is connected to the analog pad, the analog terminal being only provided along the first side of the package; and
     a digital terminal which is connected to the digital pad, the digital terminal being only provided along the second side of the package,
   wherein the analog pad is connected to the analog circuit, and the digital pad is connected to the digital circuit, and
   the buffer circuit is located closer to the fourth side of the first circuit region than the third side of the first circuit region in the first circuit region, and the oscillation circuit is located closer to the third side of the second circuit region than the fourth side of the second circuit region in the second circuit region.

2. The circuit device according to claim 1, further comprising:
   a vibrator element which is stored in the package and which is connected to the semiconductor device.

3. The circuit device according to claim 2, wherein in the semiconductor device, a vibrator pad which is connected to the vibrator element is provided along the third side of the second circuit region in the second circuit region.

4. The circuit device according to claim 3, further comprising:
   a first wire group for connecting the analog pad to the analog terminal;
   a second wire group for connecting the digital pad to the digital terminal; and
   a third wire group for connecting the vibrator element to the vibrator pad.

5. The circuit device according to claim 4, wherein the vibrator element and the vibrator pad are connected to each other by the third wire group and an in-package wiring of the package.

6. The circuit device according to claim 1, wherein in the semiconductor device, the analog pad is connected to the analog circuit in the first circuit region, and the digital pad is connected to the digital circuit in the second circuit region.

7. The circuit device according to claim 6, wherein the semiconductor device includes:

a first regulator that supplies an analog power supply voltage to the analog circuit; and
a second regulator that supplies a digital power supply voltage to the digital circuit.

8. The circuit device according to claim 1, wherein the semiconductor device includes:
a first regulator that supplies an analog power supply voltage to the analog circuit; and
a second regulator that supplies a digital power supply voltage to the digital circuit.

9. The circuit device according to claim 7, wherein the semiconductor device includes a first power supply line and a second power supply line which is separated from the first power supply line,
the analog power supply voltage is supplied from the first regulator to the analog circuit by the first power supply line, and
the digital power supply voltage is supplied from the second regulator to the digital circuit by the second power supply line.

10. The circuit device according to claim 2, wherein the vibrator element is disposed in the package so as to overlap the semiconductor device in a plan view.

11. The circuit device according to claim 2, wherein the semiconductor device includes:
the oscillation circuit that oscillates the vibrator element; and
a radio communication circuit that performs a radio communication process based on an oscillation signal from the oscillation circuit.

12. The circuit device according to claim 1, wherein the digital terminal is connected to an external control controller.

13. The circuit device according to claim 2, wherein the circuit device includes an inspection terminal, and
in the package, the inspection terminal for performing an inspection of the vibrator element is provided on an inspection side of the package which intersects the first and second sides of the package.

14. The circuit device according to claim 1, wherein the circuit device includes:
a transmission signal output terminal for radio output; and
a ground terminal for radio output, and
the analog terminal includes the transmission signal output terminal, and
the ground terminal is disposed adjacent to the transmission signal output terminal.

15. An electronic apparatus comprising the circuit device according to claim 1.

16. A moving object comprising the circuit device according to claim 1.

17. A circuit device comprising:
a semiconductor device, the semiconductor device including:
a first circuit region constituted by an analog circuit, the first circuit region having first and second sides opposite to each other;
a second circuit region constituted by a digital circuit, the second circuit region having first and second sides opposite to each other, wherein the second side of the first circuit region is located closer to the first side of the second circuit region than the second side of the second circuit region;
an analog pad being provided along the first side in the first circuit region; and
a digital pad being provided along the second side in the second circuit region; and
a package having the semiconductor device stored therein, the package having first and second sides opposite to each other, the first side of the package being located closer to the first side of the first circuit region than the second side of the first circuit region, the second side of the package being located closer to the second side of the second circuit region than the first side of the second circuit region, the package including:
an analog terminal which is connected to the analog pad, the analog terminal being only provided along the first side of the package; and
a digital terminal which is connected to the digital pad, the digital terminal being only provided along the second side of the package,
wherein the semiconductor device includes:
an oscillation circuit; and
a radio communication circuit that is configured to perform a radio communication process based on an oscillation signal from the oscillation circuit.

18. A circuit device comprising:
a semiconductor device, the semiconductor device including:
a first circuit region constituted by an analog circuit, the first circuit region having first and second sides opposite to each other;
a second circuit region constituted by a digital circuit, the second circuit region having first and second sides opposite to each other, wherein the second side of the first circuit region is located closer to the first side of the second circuit region than the second side of the second circuit region;
an analog pad being provided along the first side in the first circuit region; and
a digital pad being provided along the second side in the second circuit region;
a package having the semiconductor device stored therein, the package having first and second sides opposite to each other, the first side of the package being located closer to the first side of the first circuit region than the second side of the first circuit region, the second side of the package being located closer to the second side of the second circuit region than the first side of the second circuit region, the package including:
an analog terminal which is connected to the analog pad, the analog terminal being only provided along the first side of the package; and
a digital terminal which is connected to the digital pad, the digital terminal being only provided along the second side of the package; and
an inspection terminal that is configured to perform an inspection process of a vibrator element, the vibrator element being stored in the package and connected to the semiconductor device,
wherein in the package, the inspection terminal is provided on an inspection side of the package which intersects the first and second sides of the package.

19. A circuit device comprising:
a semiconductor device, the semiconductor device including:
a first circuit region constituted by an analog circuit, the first circuit region having first and second sides opposite to each other;
a second circuit region constituted by a digital circuit, the second circuit region having first and second sides opposite to each other, wherein the second side of the first circuit region is located closer to the first side of the second circuit region than the second side of the second circuit region;
an analog pad being provided along the first side in the first circuit region; and
a digital pad being provided along the second side in the second circuit region; and
a package having the semiconductor device stored therein, the package having first and second sides opposite to each other, the first side of the package being located closer to the first side of the first circuit region than the second side of the first circuit region, the second side of the package being located closer to the second side of the second circuit region than the first side of the second circuit region, the package including:
an analog terminal which is connected to the analog pad, the analog terminal being only provided along the first side of the package; and
a digital terminal which is connected to the digital pad, the digital terminal being only provided along the second side of the package,
wherein the circuit device includes a transmission signal output terminal for radio output, and a ground terminal for radio output, and
the analog terminal includes the transmission signal output terminal, and the ground terminal is disposed adjacent to the transmission signal output terminal.

\* \* \* \* \*